United States Patent
Hiramoto et al.

(10) Patent No.: US 9,425,229 B2
(45) Date of Patent: Aug. 23, 2016

(54) SOLID-STATE IMAGING ELEMENT, IMAGING DEVICE, AND SIGNAL PROCESSING METHOD INCLUDING A DISPERSING ELEMENT ARRAY AND MICROLENS ARRAY

(71) Applicant: Panasonic Intellectual Property Corporation of America, Torrance, CA (US)

(72) Inventors: Masao Hiramoto, Osaka (JP); Seiji Nishiwaki, Hyogo (JP); Toshiya Fujii, Shiga (JP); Tatsuya Nakamura, Osaka (JP)

(73) Assignee: Panasonic Intellectual Property Corporation of America, Torrance, CA (US)

( * ) Notice: Subject to any disclaimer, the term of this patent is extended or adjusted under 35 U.S.C. 154(b) by 125 days.

(21) Appl. No.: 14/353,312

(22) PCT Filed: Mar. 15, 2013

(86) PCT No.: PCT/JP2013/001778
§ 371 (c)(1),
(2) Date: Apr. 22, 2014

(87) PCT Pub. No.: WO2014/033976
PCT Pub. Date: Mar. 6, 2014

(65) Prior Publication Data
US 2014/0284455 A1 Sep. 25, 2014

(30) Foreign Application Priority Data
Sep. 3, 2012 (JP) .................. 2012-193028

(51) Int. Cl.
*H01L 27/146* (2006.01)
*H04N 9/07* (2006.01)
(52) U.S. Cl.
CPC ... *H01L 27/14625* (2013.01); *H01L 27/14627* (2013.01); *H01L 27/14629* (2013.01); *H04N 9/07* (2013.01)

(58) Field of Classification Search
CPC .... H01L 51/5275; G02B 5/18; G02B 5/1847
USPC ............... 257/432, E31.127, 40; 250/214 R; 362/326
See application file for complete search history.

(56) References Cited

U.S. PATENT DOCUMENTS

| 4,670,777 A | 6/1987 | Ishikawa et al. |
| 8,520,126 B2 * | 8/2013 | Hiramoto .......... H01L 27/14621 348/276 |

(Continued)

FOREIGN PATENT DOCUMENTS

| JP | 59-090467 A | 5/1984 |
| JP | 59-137909 A | 8/1984 |

(Continued)

OTHER PUBLICATIONS

International Search Report for corresponding International Application No. PCT/JP2013/001778 mailed Jun. 18, 2013.

*Primary Examiner* — Renee D Chavez
(74) *Attorney, Agent, or Firm* — Renner, Otto, Boisselle & Sklar, LLP

(57) ABSTRACT

This solid-state image sensor includes a photosensitive cell array including first through fourth photosensitive cells 2a to 2d, a dispersing element array including first and second dispersing elements 1a and 1b arranged to face the first and third photosensitive cells 2a and 2c, respectively, and a microlens array including first and second microlenses 4a and 4b. The first dispersing element 1a makes parts of incoming light that have come through the first microlens 4a and that have first and second color components incident on the first and second photosensitive cells 2a and 2b, respectively. The second dispersing element 1b makes parts of incoming light that have come through the second microlens 4b and that have third and fourth color components incident on the third and fourth photosensitive cells 2c and 2d, respectively. In addition, light that has not passed through the first and second microlenses 4a and 4b is also incident on the second and fourth photosensitive cells 2b and 2d.

12 Claims, 14 Drawing Sheets

(56) References Cited

U.S. PATENT DOCUMENTS

| | | | |
|---|---|---|---|
| 8,767,114 B2* | 7/2014 | Hiramoto | H01L 27/14621 348/294 |
| 8,902,339 B2* | 12/2014 | Hiramoto | H01L 27/14621 348/222.1 |
| 9,099,370 B2* | 8/2015 | Nishiwaki | H04N 5/2254 |
| 2002/0005471 A1 | 1/2002 | Suzuki | |
| 2003/0063204 A1 | 4/2003 | Suda | |
| 2010/0176473 A1* | 7/2010 | Nishiwaki | H01L 27/14621 257/432 |
| 2010/0188537 A1 | 7/2010 | Hiramoto et al. | |
| 2011/0037869 A1 | 2/2011 | Hiramoto et al. | |
| 2011/0164156 A1* | 7/2011 | Hiramoto | H01L 27/14625 348/272 |

FOREIGN PATENT DOCUMENTS

| | | |
|---|---|---|
| JP | 2000-151933 A | 5/2000 |
| JP | 2001-309395 A | 11/2001 |
| WO | WO 2009/019818 A1 | 2/2009 |
| WO | WO 2009/153937 A1 | 12/2009 |
| WO | WO 2010/070869 A1 | 6/2010 |

* cited by examiner

FIG. 1
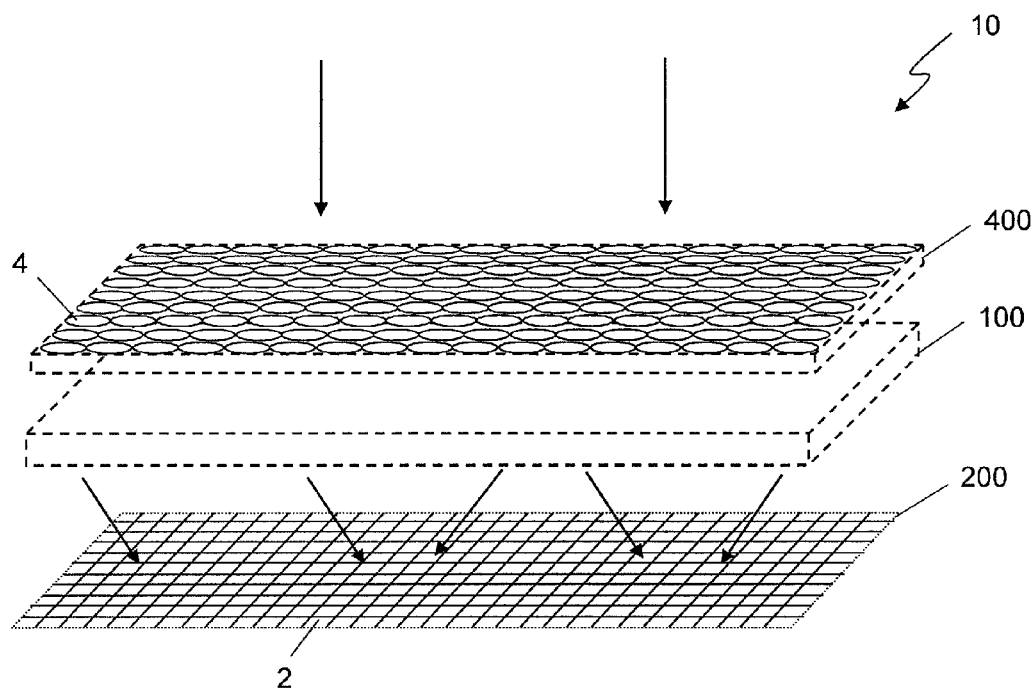
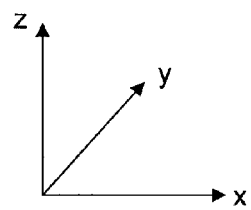

FIG. 2
(a)
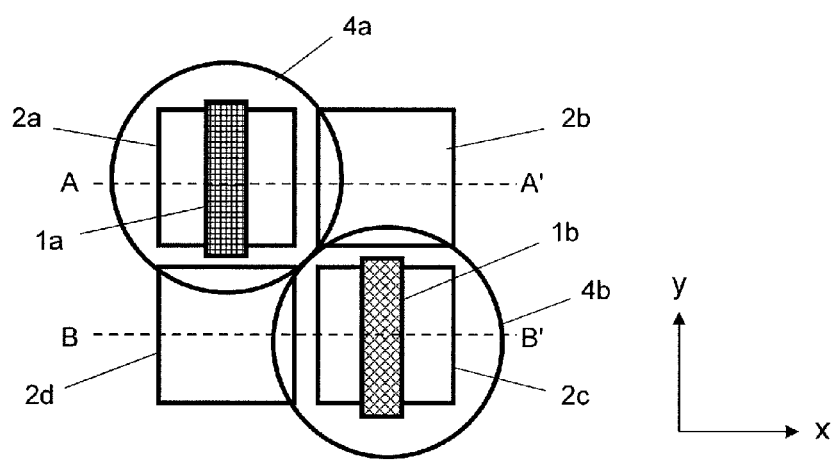
(b)
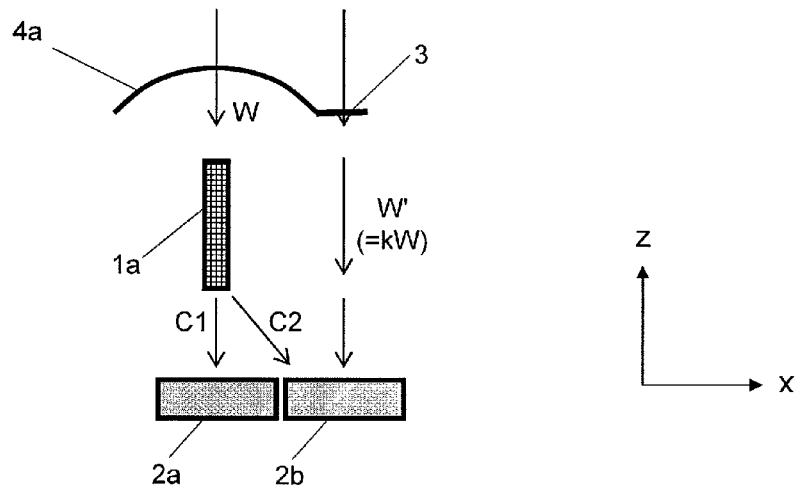
(c)
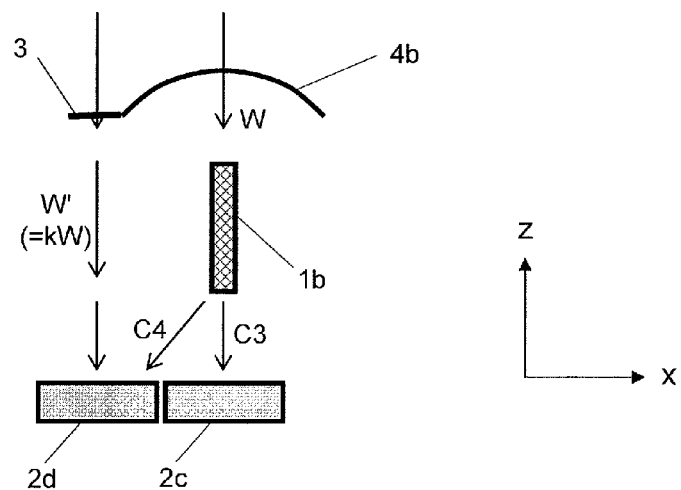

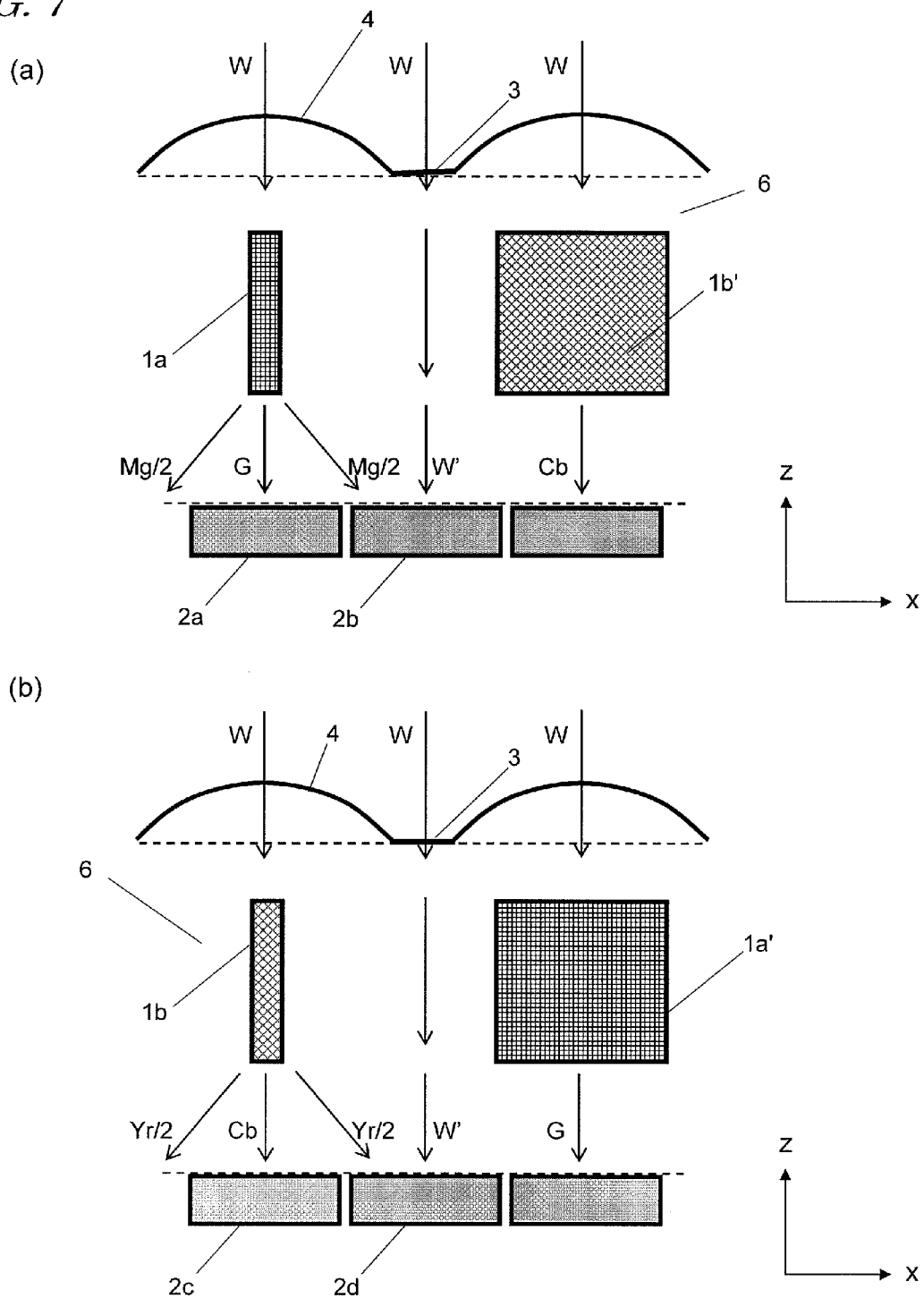

SOLID-STATE IMAGING ELEMENT, IMAGING DEVICE, AND SIGNAL PROCESSING METHOD INCLUDING A DISPERSING ELEMENT ARRAY AND MICROLENS ARRAY

TECHNICAL FIELD

The present application relates to a technique for increasing the sensitivity of a solid-state image sensor and realizing color representation.

BACKGROUND ART

Recently, the performance and functionality of digital cameras and digital movie cameras that use some solid-state image sensor such as a CCD and a CMOS (which will be simply referred to herein as an "image sensor") have been enhanced to an astonishing degree. In particular, the size of a pixel structure for use in an image sensor has been further reduced these days thanks to rapid development of semiconductor device processing technologies, thus getting an even greater number of pixels and drivers integrated together in an image sensor. And the performance of image sensors has been further enhanced as well. Meanwhile, cameras that use a backside illumination type image sensor, which receives incoming light on its back surface side, not on its principal surface side with a wiring layer for the solid-state image sensor, have been developed just recently and their property has attracted a lot of attention these days. Nevertheless, the greater the number of pixels in an image sensor, the lower the intensity of the light falling on a single pixel and the lower the sensitivity of cameras tends to be.

The sensitivity of cameras has dropped recently due to not only such a significant increase in resolution but also the use of a color-separating color filter itself. In an ordinary color camera, a subtractive color filter that uses an organic pigment as a dye is arranged to face each photosensitive cell of an image sensor. A color filter transmits one color component of incoming light to use but absorbs the other components of the light. That is why with such a color filter, the optical efficiency of a camera would decrease. Specifically, in a color camera that uses a Bayer color filter arrangement in which color filters in three colors are arranged using a combination of one red (R) pixel, two green (G) pixels and one blue (B) pixel as a fundamental unit, the R color filter transmits an R ray but absorbs G and B rays, the G color filter transmits a G ray but absorbs R and B rays, and the B color filter transmits a B ray but absorbs R and G rays. Consequently, the sum of the quantities of light that can be used by a color camera with the Bayer arrangement is approximately only one-third of the entire incoming light. Thus, the use of a color filter would cause a decrease in the optical efficiency and the sensitivity of those cameras.

Thus, to overcome such a problem, Patent Document No. 1 discloses a color representation technique for increasing the optical efficiency by using a dispersing element which splits the incoming light according to its wavelength instead of the color filter. According to such a technique, a dispersing element which is arranged to face its associated photosensitive cell makes light rays incident on multiple different photosensitive cells according to their wavelength ranges. Each of those photosensitive cells receives light in which components falling within multiple different wavelength ranges are superposed one upon the other from a plurality of dispersing elements. As a result, a color signal can be generated by performing a signal arithmetic operation using photoelectrically converted signals supplied from the respective photosensitive cells.

Meanwhile, Patent Document No. 2 discloses a color representation technique in which a dispersing element is applied to an image sensor with an oblique pixel arrangement (i.e., a so-called "honeycomb arrangement"). According to such a technique, the optical efficiency can be increased as much as in Patent Document No. 1.

CITATION LIST

Patent Literature

Patent Document No. 1: PCT International Application Publication No. 2009/153937
Patent Document No. 2: PCT International Application Publication No. 2010/070869
Patent Document No. 3: PCT International Application Publication No. 2009/019818
Patent Document No. 4: Japanese Laid-Open Patent Publication No. 59-137909

SUMMARY OF INVENTION

Technical Problem

An embodiment of the present invention provides a novel solid-state image sensor and image capture device including a dispersing element.

Solution to Problem

To overcome the problem described above, a solid-state image sensor according to an aspect of the present invention includes: a photosensitive cell array in which a plurality of unit blocks, each including first, second, third and fourth photosensitive cells, are arranged two-dimensionally on an imaging area; a dispersing element array including first and second dispersing elements which are arranged to face the first and third photosensitive cells, respectively; and a microlens array including a first microlens which is arranged to cover the first dispersing element, the first photosensitive cell and a part of the second photosensitive cell and a second microlens which is arranged to cover the second dispersing element, the third photosensitive cell and a part of the fourth photosensitive cell. The microlens array is configured so that incoming light that has reached a region which is covered with neither the first nor second microlens and which faces the second photosensitive cell is incident on the second photosensitive cell and that incoming light that has reached a region which is covered with neither the first nor second microlens and which faces the fourth photosensitive cell is incident on the fourth photosensitive cell. The first dispersing element makes light rays with first and second color components, which form respective parts of the incoming light that has come through the first microlens, incident on the first and second photosensitive cells, respectively. And the second dispersing element makes light rays with third and fourth color components, which form respective parts of the incoming light that has come through the second microlens, incident on the third and fourth photosensitive cells, respectively.

Advantageous Effects of Invention

According to an embodiment of the present invention, a color image can be captured with sufficiently high optical efficiency and resolution.

BRIEF DESCRIPTION OF DRAWINGS

FIG. 1 A perspective view schematically illustrating the relative arrangement of a photosensitive cell array 200, a dispersing element array 100 and a microlens array 400 in a solid-state image sensor 10.

FIG. 2 (*a*) is a plan view illustrating an exemplary basic configuration for the solid-state image sensor 10 and (*b*) and (*c*) are cross-sectional views as respectively viewed on the planes AA' and BB'.

FIGS. 7 (*a*) and (*b*) are cross-sectional views as respectively viewed on the planes AA' and BB' shown in FIG. 6A.

DESCRIPTION OF EMBODIMENTS

Figure 3:
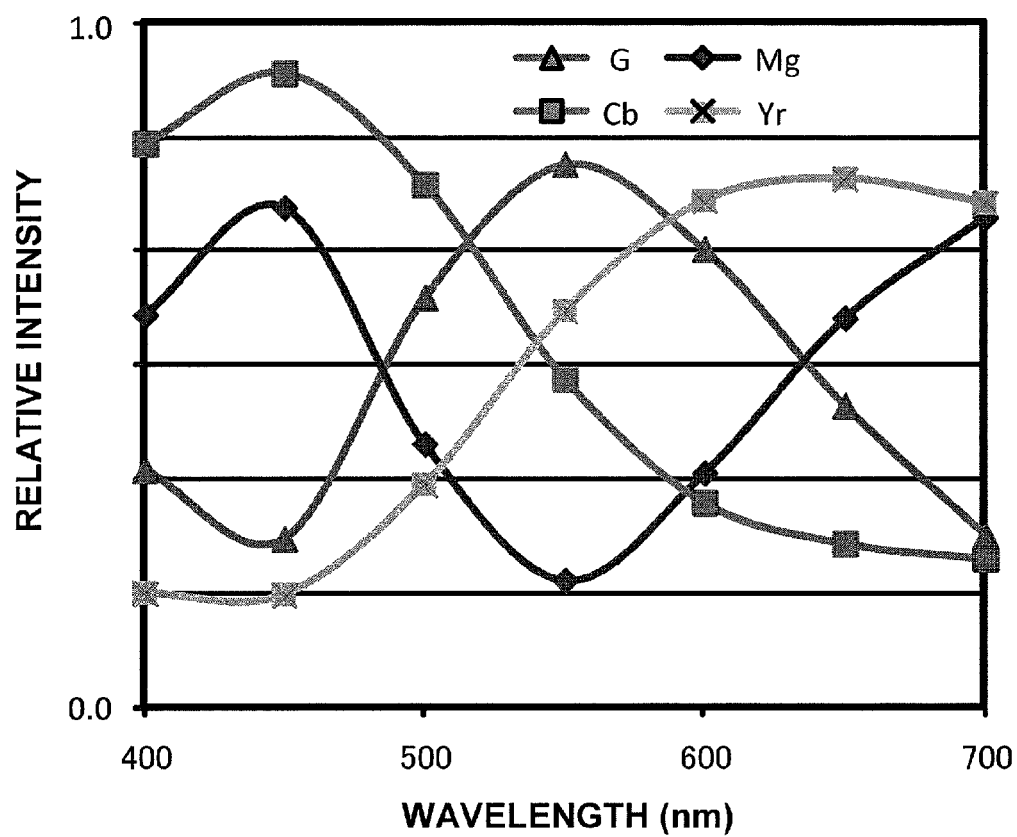
FIG. 3 Shows exemplary intensity distributions of color G, Mg, Cb and Yr components with respect to the wavelength.

Exemplary embodiments of the present invention are outlined as follows:

(1) A solid-state image sensor according to an aspect of the present invention includes: a photosensitive cell array in which a plurality of unit blocks, each including first, second, third and fourth photosensitive cells, are arranged two-dimensionally on an imaging area; a dispersing element array including first and second dispersing elements which are arranged to face the first and third photosensitive cells, respectively; and a microlens array including a first microlens which is arranged to cover the first dispersing element, the first photosensitive cell and a part of the second photosensitive cell and a second microlens which is arranged to cover the second dispersing element, the third photosensitive cell and a part of the fourth photosensitive cell. The microlens array is configured so that incoming light that has reached a region which is covered with neither the first nor second microlens and which faces the second photosensitive cell is incident on the second photosensitive cell and that incoming light that has reached a region which is covered with neither the first nor second microlens and which faces the fourth photosensitive cell is incident on the fourth photosensitive cell. The first dispersing element makes light rays with first and second color components, which form respective parts of the incoming light that has come through the first microlens, incident on the first and second photosensitive cells, respectively. And the second dispersing element makes light rays with third and fourth color components, which form respective parts of the incoming light that has come through the second microlens, incident on the third and fourth photosensitive cells, respectively.

(2) In one embodiment of the solid-state image sensor of (1), each of the first and second dispersing elements includes a high-refractive-index transparent portion and a low-refractive-index transparent portion which has a lower refractive index than the high-refractive-index transparent portion and which is arranged around the high-refractive-index transparent portion. And at least one of the shape and size of the high-refractive-index transparent portion of the first dispersing element is different from that of the high-refractive-index transparent portion of the second dispersing element.

(3) In one embodiment of the solid-state image sensor of (2), the respective high-refractive-index transparent portions of the first and second dispersing elements have a plate shape which intersects at right angles with the imaging area and are arranged parallel to each other.

(4) In one embodiment of the solid-state image sensor of (3), the orientation of the high-refractive-index transparent portion in the first dispersing element is different by 90 degrees from that of the high-refractive-index transparent portion in the first dispersing element that faces an adjacent unit block, and the orientation of the high-refractive-index transparent portion in the second dispersing element is different by 90 degrees from that of the high-refractive-index transparent portion in the second dispersing element that faces an adjacent unit block.

(5) In one embodiment of the solid-state image sensor of one of (1) to (4), the dispersing element array is configured so that light-splitting direction components that are parallel to the imaging area in a pair of the first dispersing elements which are located closest to each other intersect with each other at right angles and that light-splitting direction components that are parallel to the imaging area in a pair of the second dispersing elements which are located closest to each other intersect with each other at right angles.

(6) In one embodiment of the solid-state image sensor of one of (1) to (5), the first dispersing element makes one and the other halves of the light ray with the second color component that forms part of the incoming light incident on the second photosensitive cell of its own and on the second photosensitive cell in any of adjacent unit blocks, and the second dispersing element makes one and the other halves of the light ray with the fourth color component that forms part of the incoming light incident on the fourth photosensitive cell of its own and on the fourth photosensitive cell in any of the adjacent unit blocks.

(7) In one embodiment of the solid-state image sensor of one of (1) to (6), the second photosensitive cell receives not only the light rays with the second color component from the first dispersing element of its own and the first dispersing element in any of the adjacent unit blocks but also light rays with the first and second color components that have come directly without passing through the first and second microlenses, and outputs a photoelectrically converted signal based on the light rays received. And the fourth photosensitive cell receives not only the light rays with the fourth color component from the second dispersing element of its own and the fourth dispersing element in any of the adjacent unit blocks but also light rays with the third and fourth color components that have come directly without passing through the first and second microlenses, and outputs a photoelectrically converted signal based on the light rays received.

(8) In one embodiment of the solid-state image sensor of one of (1) to (7), the first dispersing element makes almost all of the light ray with the first color component, which forms part of the incoming light, incident on the first photosensitive cell that faces the first dispersing element, and the second dispersing element makes almost all of the light ray with the third color component, which forms part of the incoming light, incident on the third photosensitive cell that faces the second dispersing element.

(9) In one embodiment of the solid-state image sensor of one of (1) to (8), the second color component is the complementary color of the first color component and the fourth color component is the complementary color of the third color component.

(10) In one embodiment of the solid-state image sensor of one of (1) to (9), the first color component is one of magenta and green, the second color component is the other of magenta and green, the third color component is one of red with a tint of green and blue with a tint of green, and the fourth color component is the other of red with a tint of green and blue with a tint of green.

(11) An image capture device according to another aspect of the present invention includes: the solid-state image sensor of one of (1) to (10); an optical system which produces an image on the solid-state image sensor; and a signal processing section which processes the output signals of the solid-state image sensor and which generates color information by performing an arithmetic operation using first, second, third and fourth photoelectrically converted signals supplied from the first, second, third and fourth photosensitive cells, respectively.

(12) A method according to another aspect of the present invention is a method for processing the output signals of the solid-state image sensor of one of (1) to (10), and includes the steps of: getting first, second, third and fourth photoelectrically converted signals from the first, second, third and fourth photosensitive cells, respectively; and generating color information using the first through fourth photoelectrically converted signals.

(13) A program according to another aspect of the present invention is a program for processing the output signals of the solid-state image sensor of one of (1) to (10), and is defined to make a computer perform the steps of: getting first, second, third and fourth photoelectrically converted signals from the first, second, third and fourth photosensitive cells, respectively; and generating color information using the first through fourth photoelectrically converted signals.

Before specific embodiments of the present invention are described, first of all, it will be described with reference to FIG. 1 what basic configuration a solid-state image sensor 10 according to an embodiment of the present invention has and how the image sensor 10 operates in principle. In the following description, to spatially split incident light into multiple components of light falling within mutually different wavelength ranges or having respectively different color components will be sometimes referred to herein as "splitting of light". Also, the minimum spatial unit for sensing light will be referred to herein as a "photosensitive cell" or a "pixel". In the following description, the xyz coordinates shown on the drawings will be used. The imaging area of the image sensor 10 is supposed to be an "xy plane" and "x, y and z axes" are defined to be the horizontal direction on the imaging area, the vertical direction on the imaging area, and the direction that intersects at right angles with the imaging area, respectively. It should be noted that the "horizontal direction" and "vertical direction" herein mean directions on the imaging area which respectively correspond to the lateral and longitudinal directions on an image to be generated.

FIG. 1 is a perspective view schematically illustrating a portion of an image sensor 10 according to an embodiment. The image sensor 10 includes a photosensitive cell array 200 in which a plurality of photosensitive cells 2 (which will be sometimes referred to herein as "pixels") are arranged two-dimensionally on an imaging area, a dispersing element array 100 including a plurality of dispersing elements, and a microlens array 400 including a plurality of microlenses 4. The light that has entered this image sensor is incident on the microlens array 400, the dispersing element array 100 and the photosensitive cell array 200 in this order and eventually is converted into an electrical signal by the respective photosensitive cells 2. The dispersing element array 100 is illustrated in FIG. 1 as a quadrangular prism for the sake of simplicity, but actually does not have such a shape but has a more complex structure.

On receiving incoming light, each photosensitive cell 2 performs photoelectric conversion on the light and outputs an electrical signal representing the intensity of the light received. Such an electrical signal will be sometimes referred to herein as a "photoelectrically converted signal" or a "pixel signal". Each photosensitive cell 2 receives multiple light rays that have been split by a dispersing element included in the dispersing element array 100.

The photosensitive cell array 200 is comprised of a plurality of unit blocks, each of which includes four photosensitive cells. Two dispersing elements with mutually different light-splitting properties are arranged to face the two photosensitive cells in each unit block. Those dispersing elements together form a dispersing element array 100. In addition, microlenses 4 are arranged to face those dispersing elements.

FIG. 2 is a schematic representation illustrating the basic structure of the image sensor 10. Specifically, FIG. 2(a) is a plan view illustrating four photosensitive cells 2a through 2d which form a single unit block of the photosensitive cell array 200 and two dispersing elements 1a and 1b and two microlenses 4a and 4b which are arranged to face them. FIGS. 2(b) and 2(c) are schematic cross-sectional views as respectively viewed on the planes AA' and BB' shown in FIG. 2(a). Even though the four photosensitive cells 2a through 2d are arranged in two columns and two rows in this example, this is just an example. Alternatively, the four photosensitive cells 2a through 2d may also be arranged to form a zigzag pattern obliquely as in the embodiments to be described later.

As shown in FIG. 2(a), the first and second dispersing elements 1a and 1b are arranged so as to face the first and third photosensitive cells 2a and 2c, respectively. A first microlens 4a is arranged so as to cover not only the first dispersing element 1a and the first photosensitive cell 2a entirely but also the second photosensitive cell 2b partially. In the same way, a second microlens 4b is arranged so as to cover not only the second dispersing element 1b and the third dispersing element 1c entirely but also the fourth photosensitive cell 2d partially. With such a configuration, the incoming light which has been incident on the microlens 4a is converged by the dispersing element 1a and split according to its wavelength range (color component). Likewise, the incoming light which has been incident on the microlens 4b is converged by the dispersing element 1b and split according to its wavelength range (color component). Meanwhile, the incoming light which has entered a region that is not covered with the microlens 4a, 4b and that faces the second photosensitive cell 2b is incident as it is on the second photosensitive cell 2b without being split. In the same way, the incoming light which has entered a region that is not covered with the microlens 4a, 4b and that faces the fourth photosensitive cell 2d is incident as it is on the fourth photosensitive cell 2d without being split. In the following description, those regions of the microlens array 400 which are not covered with the microlenses 4a, 4b will be sometimes referred to herein as "non-light-splitting portions".

Hereinafter, the functions of the dispersing elements 1a and 1b will be described with reference to FIGS. 2(b) and 2(c). In the following description, the intensity of the visible radiation to be converged by the microlenses 4a and 4b onto the dispersing elements 1a and 1b, respectively, will be identified herein by the reference sign W and the intensity of the visible radiation to be transmitted through the non-light-splitting portion 3 and incident on the photosensitive cell 2b or 2d right under the non-light-splitting portion 3 will be identified herein by the reference sign W' (=kW where k is a real number that satisfies 0<k<1).

The first dispersing element 1a is configured to make a portion of the incoming light which has entered through the first microlens 4a (with the intensity W) and which has the first color component (with the intensity C1) incident on the first photosensitive cell 2a and to make another portion of the incoming light which has the second color component (with the intensity C2) incident on the second photosensitive cell. In this example, the second color component corresponds to the complementary color of the first color component, and W=C1+C2. On the other hand, the second dispersing element 1b is configured to make a portion of the incoming light which has entered through the second microlens 4b (with the intensity W) and which has the third color component (with the intensity C3) incident on the third photosensitive cell 2c and to make another portion of the incoming light which has the fourth color component (with the intensity C4) incident on the fourth photosensitive cell 2d. In this example, the fourth color component corresponds to the complementary color of the third color component, and W=C3+C4.

It should be noted that even if the first and second color components are complementary colors, the wavelength ranges of the light rays with the first and second color components do not have to be completely separate from each other but may partially overlap with each other. Likewise, the wavelength ranges of the light rays with the third and fourth color components may partially overlap with each other, too.

For example, the first through fourth color components may be the color magenta (Mg), the color green (G), the color red including about one half of the color green component (R+1/2G, which will be identified herein by "Yr") and the color blue including about one half of the color green component (B+1/2G, which will be identified herein by "Cb"), respectively. However, as long as those four color components are included within the range of the visible radiation, any other combination may also be used.

FIG. 3 shows the intensity distributions of the respective color components with respect to the wavelength (which will be sometimes referred to herein as a "spectral distributions") in a situation where the first through fourth color components are G, Mg, Cb and Yr, respectively. As shown in FIG. 3, G is a color component which consists mostly of components falling within the color green wavelength range (of around 500 to 600 nm) but which may include some additional components falling within other wavelength ranges. Mg is a color component which consists mostly of components falling within the color blue wavelength range (of around 400 to 500 nm) and components falling within the color red wavelength range (of around 600 to 700 nm) but which may include some additional components falling within the color green wavelength range. Cb is a color component which consists mostly of components falling within the color blue to the shorter-wave half of the color green wavelength range (of around 400 to 550 nm) but which may include some additional components falling within other wavelength ranges. Yr is a color component which consists mostly of components falling within the longer-wave half of the color green to the color red wavelength range (of around 550 to 700 nm) but which may include some additional components falling within other wavelength ranges.

Each of these dispersing elements 1a and 1b may be comprised of a "high-refractive-index transparent portion" and a "low-refractive-index transparent portion" which surrounds it as will be described in detail later. Alternatively, the dispersing element 1a, 1b may also be implemented as a microlens, of which the shape and refractive index have been designed appropriately. Still alternatively, the dispersing element 1a, 1b may also be implemented using a multilayer filter (dichroic mirror) which reflects a light ray falling within a particular wavelength range and transmits a light ray falling within the other wavelength ranges. If a multilayer filter is used as a dispersing element, the dispersing element may be configured to totally reflect the light ray that has been reflected from the multilayer filter and to guide the light ray to an adjacent photosensitive cell.

With such a configuration adopted, the photosensitive cells 2a to 2d receive light rays, of which the intensities are represented by C1, C2+kW, C3 and C4+kW, respectively, as shown in FIGS. 2(b) and 2(c) and the respective photosensitive cells output photoelectrically converted signals corresponding to those intensities. The output signals of those photosensitive cells include mutually different pieces of color information. That is why if a 3×4 matrix with appropriately set parameters is used, RGB color signals can be calculated by performing an arithmetic operation based on that matrix.

More specifically, if the photoelectrically converted signals which are output from the photosensitive cells 2a, 2b, 2c and 2d are identified herein by S2a, S2b, S2c and S2d, respectively, and if the signal components representing the color components C1, C2, C3, C4 and W are identified herein by adding the subscript "s" to their reference signs, S2a through S2d can be represented by the following Equations (1) to (4), respectively:

$$S2a = C1s \tag{1}$$

$$S2b = C2s + kWs = kC1s + (1+k)C2s \tag{2}$$

$$S2c = C3s \tag{3}$$

$$S2d = C4s + kWs = kC3s + (1+k)C4s \tag{4}$$

Since the signals C1s, C2s and C3s can be represented as linear combinations of RGB signals Rs, Gs and Bs, the signals S2a through S2d can also be represented as linear combinations of Rs, Gs and Bs. That is to say, if a11 through a43 are predetermined coefficients, S2a through S2d can be represented by the following Equation (5):

$$\begin{pmatrix} S2a \\ S2b \\ S2c \\ S2d \end{pmatrix} = \begin{pmatrix} a11 & a12 & a13 \\ a21 & a22 & a23 \\ a31 & a32 & a33 \\ a41 & a42 & a43 \end{pmatrix} \begin{pmatrix} Rs \\ Gs \\ Bs \end{pmatrix} \quad (5)$$

Since the coefficients a11 through a43 are known quantities to be determined in advance via experiments or simulations, the signals Rs, Gs and Bs can be obtained by performing an inverse arithmetic operation of Equation (5). And by performing this arithmetic operation on a unit block basis, an RGB color image can be obtained.

As can be seen, an image sensor 10 according to an embodiment of the present invention can obtain color information by performing a signal arithmetic operation using dispersing elements without using any color filter that would absorb the incoming light. As a result, the loss of the light can be minimized and the image capturing sensitivity can be increased. On top of that, since information about the light rays (kW) which are transmitted through regions without the microlenses 4a, 4b (non-light-splitting portions 3) and incident on the photosensitive cells 2b and 2d can be obtained, the resolution can be increased compared to a configuration with no non-light-splitting portions 3. In addition, since each of the dispersing elements 1a, 1b splits the incoming light W into two light rays and makes those two light rays incident on two photosensitive cells, it is possible to avoid a situation where only a particular pixel has a significantly large or small signal value as long as the coefficient k is a relatively small numerical value. In other words, the dynamic range characteristic of the image sensor 10 with respect to the incoming light can be improved.

Hereinafter, more specific embodiments will be described with reference to FIG. 4A and other drawings. In the following description, any pair of components having the same or substantially the same function will be identified by the same reference numeral.

Embodiment 1

Figure 4A:
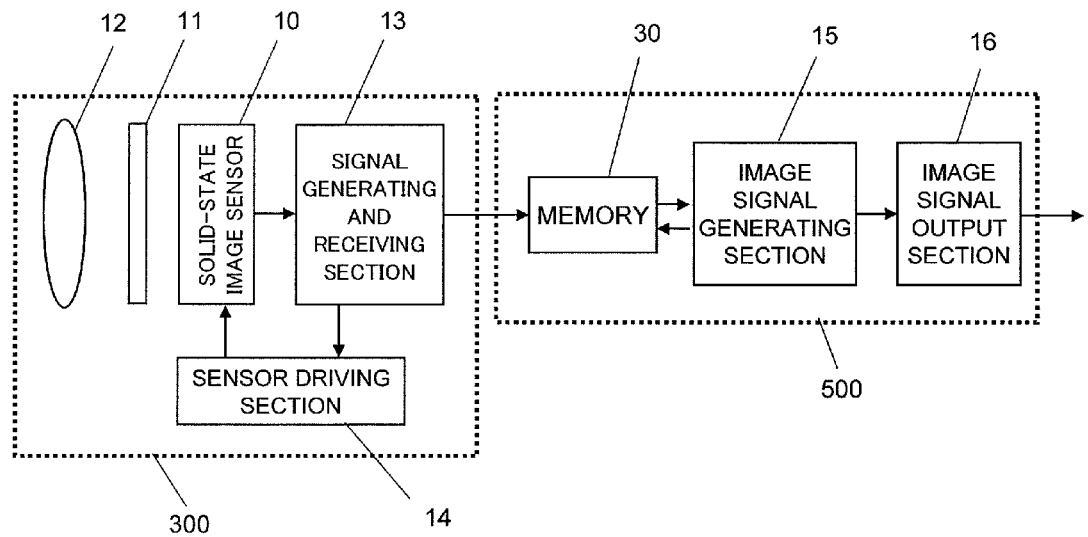
FIG. 4A A block diagram illustrating a general configuration for an image capture device as a first embodiment.

FIG. 4A is a block diagram illustrating an overall configuration for an image capture device as a first embodiment. The image capture device of this embodiment is a digital electronic camera and includes an image capturing section 300 and a signal processing section 500 which receives a signal from the image capturing section 300 and outputs a signal representing an image (i.e., an image signal). The image capture device may either generate only a still picture or have the function of generating a moving picture.

The image capturing section 300 includes an optical lens 12 which images a given subject, an infrared cut filter 11, and a solid-state image sensor 10 (which will be simply referred to herein as an "image sensor") which converts the optical information that has been gotten through the optical lens 12 and the infrared cut filter 11 into an electrical signal by photoelectric conversion. The image capturing section 300 further includes a signal generating and receiving section 13 which not only generates a fundamental signal to drive the image sensor 10 but also receives the output signal of the image sensor 10 and sends it to the signal processing section 500 and a sensor driving section 14 which drives the image sensor 10 in accordance with the fundamental signal generated by the signal generating and receiving section 13. The optical lens 12 is a known lens and may be a lens unit including multiple lenses such as a zoom lens and a focus lens. The infrared cut filter 11 filters out infrared rays and transmits visible radiation and makes the visible radiation incident on the solid-state image sensor 10. Optionally, a quartz crystal low-pass filter which reduces a moiré pattern to be caused by a pixel arrangement may also be provided along with the infrared cut filter 11. The image sensor 10 is typically a CMOS or a CCD, and may be fabricated by known semiconductor device processing technologies. The signal generating and receiving section 13 and the sensor driving section 14 may be implemented as an LSI such as a CCD driver.

The signal processing section 500 includes an image signal generating section 15 which generates an image signal by processing the signal supplied from the image capturing section 300, a memory 30 which stores various kinds of data that have been produced while the image signal is being generated, and an image signal output section 16 which sends out the image signal thus generated to an external device. The image signal generating section 15 is suitably a combination of a hardware component such as a known digital signal processor (DSP) and a software program for use to perform image processing involving the image signal generation. The memory 30 may be a DRAM, for example. And the memory 30 not only stores the signal supplied from the image capturing section 300 but also temporarily holds the image data that has been generated by the image signal generating section 15 or compressed image data. These image data are then output to either a storage medium or a display section (neither is shown) by way of the image signal output section 16.

The image capture device of this embodiment actually further includes an electronic shutter, a viewfinder, a power supply (or battery), a flashlight and other known components. However, description thereof will be omitted herein because none of them are essential components that would make it difficult to understand how the present invention works unless they were described in detail. It should also be noted that this configuration is just an example. Rather, this embodiment may also be carried out as any other appropriate combination of known elements as long as the image sensor 10 and the image signal generating section 15 are included.

Hereinafter, the solid-state image sensor 10 of this embodiment will be described.

Figure 4B:
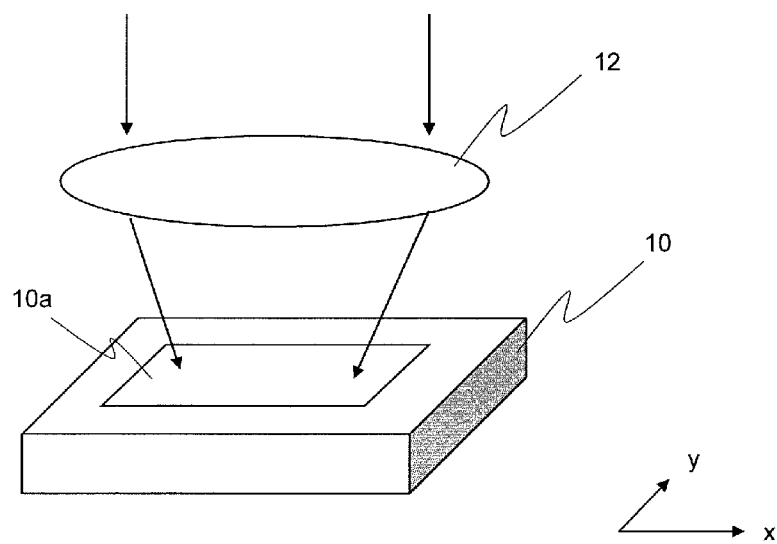
FIG. 4B Illustrates a lens and image sensor according to the first embodiment.

FIG. 4B schematically illustrates how the light that has been transmitted through the lens 12 is incident on the image sensor 10 during an exposure process. In FIG. 4, shown are only the lens 12 and the image sensor 10 with illustration of the other components omitted for the sake of simplicity. Also, although the lens 12 actually often consists of a number of lenses that are arranged in the optical axis direction, the lens 12 shown in FIG. 4 is illustrated as a single lens in a simplified form. On the imaging area 10a of the image sensor 10, arranged two-dimensionally are a number of photosensitive cells (pixels) that form a photosensitive cell array. Those photosensitive cells are typically photodiodes, each of which outputs, as a pixel signal, a photoelectrically converted signal representing the quantity of the light received (which will be referred to herein as an "incident light quantity") by photoelectric conversion. The light (visible radiation) that has been transmitted through the lens 12 and the infrared cut filter 11 is incident on the imaging area 10a. Generally speaking, the intensity of the light impinging on the imaging area 10a and the distribution of the quantities of incoming light rays that fall within multiple different wavelength ranges (which will be referred to herein as a "split light distribution") vary from one point of incidence to another.

Figure 5A:
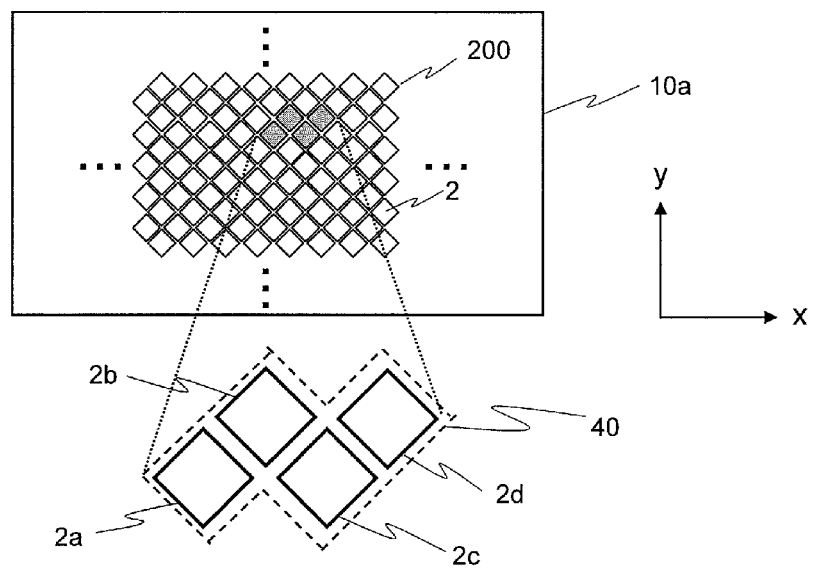
FIG. 5A Illustrates an exemplary pixel arrangement for an image sensor according to the first embodiment.
Figure 5B:
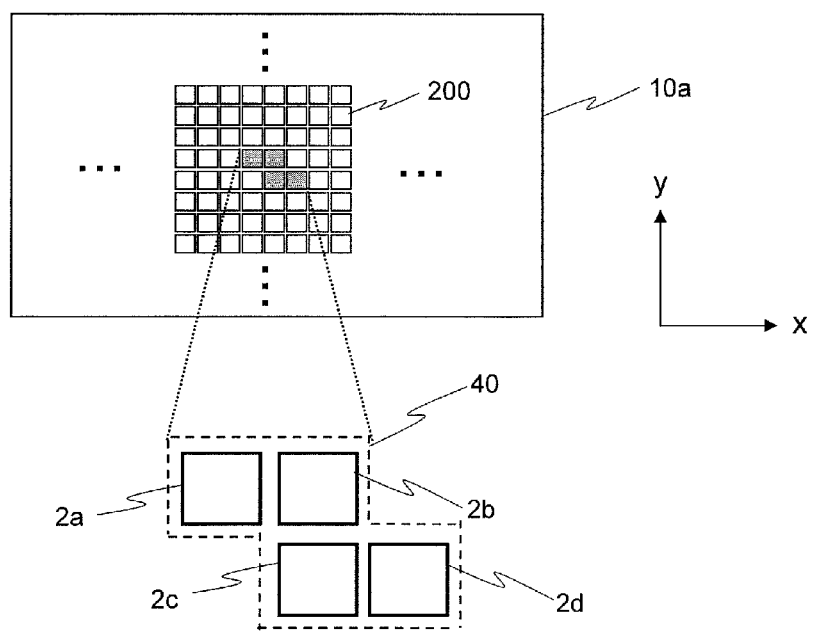
FIG. 5B Illustrates a modified pixel arrangement for the image sensor.

FIGS. 5A and 5B are plan views illustrating exemplary pixel arrangements according to this embodiment. As shown in FIG. 5A, the photosensitive cell array 200 includes a plurality of photosensitive cells 2 which are arranged two-dimensionally on the imaging area 10a so as to define an angle of rotation of 45 degrees with respect to each of the x- and y-axis directions. Such an arrangement is called either a "diagonal arrangement" or a "honeycomb arrangement" and contributes to increasing the horizontal and vertical resolutions compared to an ordinary tetragonal lattice arrangement. The photosensitive cell array 200 is comprised of a plurality of unit blocks 40, each of which includes four photosensitive cells 2a, 2b, 2c and 2d. In this embodiment, each unit block 40 is comprised of four photosensitive cells 2a through 2d which are arranged to form a zigzag pattern obliquely with respect to the horizontal and vertical directions as shown in FIGS. 5A and 5B. Specifically, the first and second photosensitive cells 2a and 2b are arranged in a first direction, the second and third photosensitive cells 2b and 2c are arranged in a second direction which intersects with the first direction, and the third and fourth photosensitive cells 2c and 2d are arranged in the first direction. However, these photosensitive cells 2 do not have to have such a diagonal arrangement but may also have the tetragonal arrangement shown in FIG. 5B or any other arrangement as well. Optionally, each unit block may be comprised of five or more photosensitive cells as well. It should be noted that even though lines for connecting the respective photosensitive cells 2 to a read circuit (not shown) are actually provided, illustration of those lines is omitted from the drawings of the present application for the sake of simplicity.

A dispersing element array comprised of multiple dispersing elements and a microlens array comprised of multiple microlenses are arranged closer to the light source so as to face this photosensitive cell array 200. In this embodiment, two dispersing elements and two microlenses are arranged so as to face the four photosensitive cells included in each unit block.

Hereinafter, the dispersing elements of this embodiment will be described.

The dispersing element of this embodiment is an optical element which refracts incoming light to multiple different directions according to the wavelength range by utilizing diffraction of the light to produce on the boundary between two different light-transmitting members with mutually different refractive indices. The dispersing element that type includes high-refractive-index transparent portions (core portions), which are made of a material with a relatively high refractive index, and low-refractive-index transparent portions (clad portions), which are made of a material with a relatively low refractive index and which contact with side surfaces of the core portions. Since the core portion and the clad portion have mutually different refractive indices, a phase difference is caused between the light rays that have been transmitted through the core and clad portions, thus producing diffraction. And since the magnitude of the phase difference varies according to the wavelength of the light, the incoming light can be spatially separated according to the wavelength range into multiple light rays with respective color components. For example, one and the other halves of a light ray with a first color component can be refracted toward first and second directions, respectively, and a light ray with a color component other than the first color component can be refracted toward a third direction. Alternatively, three light rays falling within mutually different wavelength ranges (i.e., having mutually different color components) could be refracted toward three different directions, too.

In this description, these terms "high-refractive-index" and "low-refractive-index" do not indicate the absolute levels of the refractive indices but refer to relative levels of the refractive indices to be compared to each other. That is to say, the "low-refractive-index" means that the refractive index of the low-refractive-index transparent portion is lower than that of the high-refractive-index transparent portion. On the other hand, the "high-refractive-index" means that the refractive index of the high-refractive-index transparent portion is higher than that of the low-refractive-index transparent portion. That is why as long as the refractive index of the low-refractive-index transparent portion is lower than that of the high-refractive-index transparent portion, their refractive indices may be arbitrary ones.

In this embodiment, the low-refractive-index transparent portions have been formed so as to form a layer within the dispersing element array 100, and therefore, will be sometimes referred to herein as a "low-refractive-index transparent layer". The respective high-refractive-index transparent portions which are embedded in the low-refractive-index transparent layer locally decrease the phase velocity of the light that has been incident on the low-refractive-index transparent portions. As a result, when the light that has been incident on the upper surface of the low-refractive-index transparent portions propagate toward the lower surface, a phase shift is caused to a degree that varies according to the wavelength and the incoming light is split. For that reason, each high-refractive-index transparent portion will be sometimes referred to herein as a "dispersing element". Such a dispersing element may also be called a "phase shifter".

In each dispersing element, the high-refractive-index transparent portion has a plate shape. In the case of the configuration shown in FIG. 5A, the high-refractive-index transparent portion has a rectangular parallelepiped shape, of which one side that defines an angle of rotation of 45 degrees counterclockwise with respect to the x-axis direction is the shortest and another side that defines an angle of rotation of degrees counterclockwise with respect to the y-axis direction is the longest. On the other hand, if the configuration shown in FIG. 5B is adopted, the high-refractive-index transparent portion has a rectangular parallelepiped shape, of which one side in the x-axis direction is the shortest and another side in the y-axis direction is the longest. The high-refractive-index transparent portion does not have to have an exactly rectangular parallelepiped shape but may also have rounded edges or tapered or inversely tapered side surfaces. In this description, the term "plate shape" will refer broadly to any shape in which the shortest side of the high-refractive-index transparent portion is a half or less as long as the sides in the other two directions that intersect with that side at right angles. By adjusting the size, shape, refractive index and other parameters of the high-refractive-index transparent portions, it can be controlled how to split the incoming light. A more specific configuration and function of the high-refractive-index transparent portion is disclosed in Patent Document No. 3, the entire disclosure of which is hereby incorporated by reference.

Figure 6A:
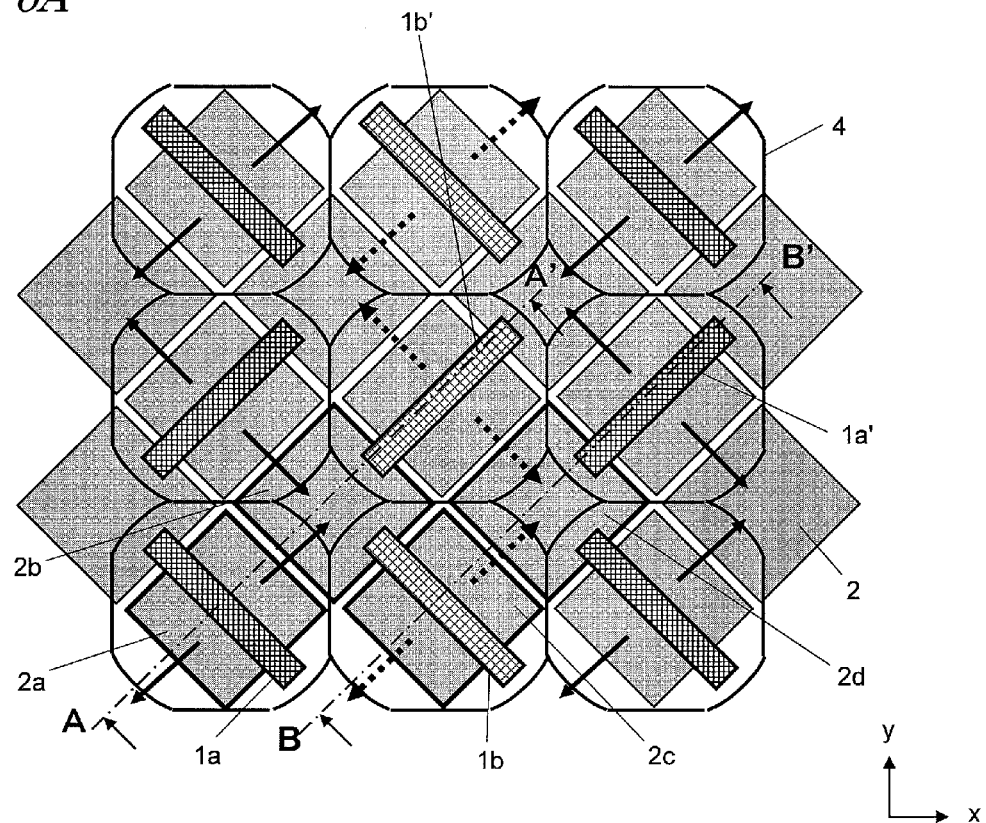
FIG. 6A A plan view illustrating the basic structure of an image sensor according to the first embodiment.
Figure 6B:
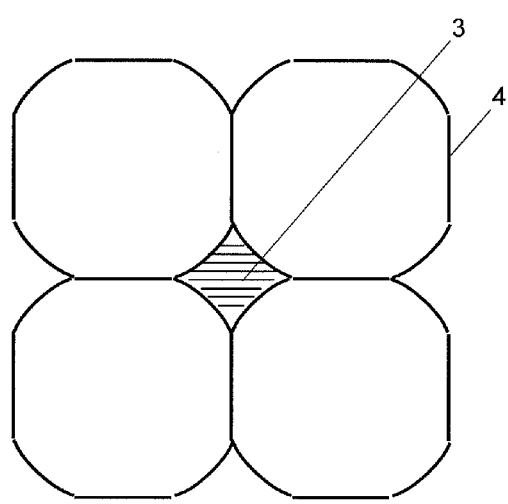
FIG. 6B A partial plan view illustrating microlenses 4 as the object of attention.

FIG. 6A is a plan view illustrating the basic structure of the image sensor 10. In FIG. 6A, the four photosensitive cells 2a through 2d indicated by the bold solid lines form a single unit block. As shown in FIG. 6B, two kinds of dispersing elements 1a and 1b are arranged so as to alternate with each other every other pixel in both of the horizontal and vertical (x and y) directions. Each of the dispersing elements 1a which are arranged vertically changes its orientation by 90 degrees compared to the previous one. Likewise, each of the dispersing elements 1b which are arranged vertically also changes its orientation by 90 degrees compared to the previous one. In other words, the orientation of the dispersing element 1a in a single unit block is different by 90 degrees from that of the dispersing element 1a that belongs to an adjacent unit block and that faces the former dispersing element 1a. In the same way, the orientation of the dispersing element 1b in a single unit block is different by 90 degrees from that of the dispersing element 1b that belongs to an adjacent unit block and that faces the former dispersing element 1b. Each pair of the two kinds of dispersing elements 1a, 1b included in a single unit block are parallel to each other. As a result, the respective components of the light-splitting directions of the closest pair of first dispersing elements 1a that are parallel to the imaging area (i.e., the directions indicated by the solid arrows in FIG. 6A) intersect with each other at right angles. In the same way, the respective components of the light-splitting directions of the closest pair of second dispersing elements 1b that are parallel to the imaging area (i.e., the directions indicated by the dotted arrows in FIG. 6A) intersect with each other at right angles, too. A microlens 4 is arranged over each of the dispersing elements 1a and 1b. In the following description, those microlenses 4a and 4b will be collectively referred to herein as "microlenses 4".

FIG. 6B illustrates how the microlenses 4 may be arranged. Each of these microlenses 4 has an almost square shape but its corner portions are rounded. That is why each region surrounded with the corner portions of four microlenses 4 that are located close to each other has no light condensing function. Thus, the incoming light that has passed through such a region is incident as it is on the photosensitive cell right under that region without being split. For that reason, such a region will be referred to herein as a "non-light-splitting portion 3".

It should be noted that the dispersing element 1a, 1b which has a higher refractive index than its surrounding works as a waveguide to which the incoming light is introduced. That is why part of the light that has been transmitted through the non-light-splitting portion 3 is attracted to the dispersing element 1a, 1b. For that reason, if the size of the non-light-splitting portion 3 were too small, no light could be incident on the photosensitive cell 2b, 2d that faces the non-light-splitting portion 3. In this embodiment, the size and shape of the non-light-splitting portion 3 are designed appropriately so that the light that has passed through the non-light-splitting portion 3 will be incident directly onto the photosensitive cell 2b, 2d.

FIGS. 7(a) and 7(b) are cross-sectional views as respectively viewed on the planes AA' and BB' shown in FIG. 6A and illustrate the relative arrangement of the photosensitive cells 2a through 2d, dispersing elements 1a and 1b and microlenses 4 which are included in a single unit block. As shown in FIGS. 7(a) and 7(b), a plurality of microlenses 4 are arranged on the surface of the image sensor 10 and dispersing elements 1a and 1b are arranged under those microlenses 4. The dispersing elements 1a and 1b which are high-refractive-index transparent portions are surrounded with a low-refractive-index transparent layer 6. As described above, the ratio of the number of the photosensitive cells to that of the dispersing elements is two to one. As shown in FIG. 7(a), a photosensitive cell 2a is arranged right under the dispersing element 1a and a photosensitive cell 2b is arranged right under a region between the dispersing element 1a and a dispersing element 1b' of an adjacent unit block. Also, as shown in FIG. 7(b), a photosensitive cell 2c is arranged right under the dispersing element 1b and a photosensitive cell 2d is arranged right under a region between the dispersing element 1b and a dispersing element 1a' of an adjacent unit block. And in order to condense the incoming light onto the respective photosensitive cells efficiently, microlenses 4 are arranged so as to face the photosensitive cells 2a and 2c with a transparent layer 6 interposed between them.

Each of the dispersing elements 1a and 1b has a rectangular cross section, which is elongated in the light-transmitting direction, and splits the incoming light into multiple light rays by taking advantage of a difference in refractive index between itself and the transparent layer 6. Specifically, the dispersing element 1a makes a green (G) ray incident on the photosensitive cell 2a that faces the element 1a and also makes one and the other halves of a magenta (Mg) ray incident on photosensitive cells 2b of two adjacent unit blocks, respectively. On the other hand, the dispersing element 1b makes a blue (Cb) ray including about one half of the color green component (i.e., the shorter-wave portion of the color green component) incident on the photosensitive cell 2c that faces the element 1b and also makes a red (Yr) ray including about the other half (i.e., the longer-wave portion of the color green component) incident on photosensitive cells 2c of two adjacent unit blocks, respectively. According to this embodiment, the dispersing elements 1a and 1b have their length and thickness determined so as to have the light-splitting property described above. The G, Mg, Cb and Yr rays to be produced by splitting the white light that has been incident on the dispersing elements 1a, 1b may have the spectral distributions such as the ones shown in FIG. 3, for example.

The dispersing elements 1a and 1b may be made of silicon nitride (SiN), for example. The low-refractive-index transparent layer 6 may be made of silicon dioxide ($SiO_2$), for example. However, the dispersing element array 100 does not have to be made of these materials. Optionally, in order to correct the light-splitting property, a substance which absorbs light falling within a particular wavelength range may be added to a portion of the high-refractive-index transparent portion or low-refractive-index transparent layer 6 that forms the dispersing element 1a, 1b.

Figure 8:
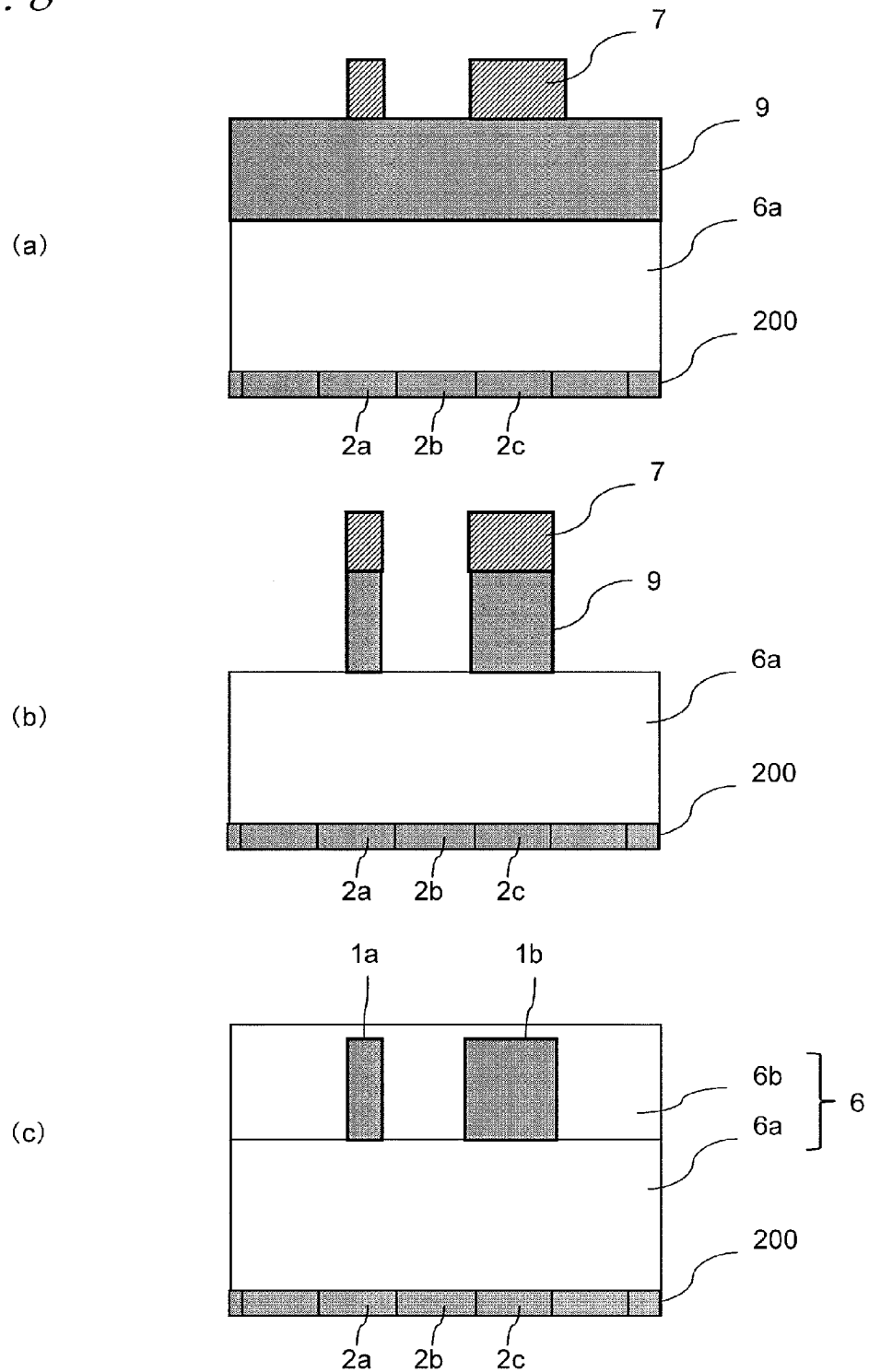
FIG. 8 (*a*) to (*c*) are cross-sectional views illustrating respective manufacturing process steps to make the dispersing element array 100.

Hereinafter, it will be described with reference to FIG. 8 how the dispersing element array 100 for use in this embodiment may be fabricated.

First of all, as shown in FIG. 8(a), a first low-refractive-index transparent layer 6a which will form part of a low-refractive-index transparent layer 6 is deposited on the photosensitive cell array 200. Such a first low-refractive-index transparent layer 6a may be deposited by a known thin film deposition technique, which may be a CVD (chemical vapor deposition) or sputtering technique, for example. Then, a transparent film 9, of which the refractive index is higher than that of the low-refractive-index transparent layer 6, is deposited on the first low-refractive-index transparent layer 6a. This transparent layer 9 may also be deposited by a known thin film deposition technique. Next, an etching mask pattern 7 is defined on the transparent layer 9 by photolithographic technique. If the photomask pattern is designed by photolithographic technique, an etching mask pattern 7 with an arbitrary planar shape can be formed.

Next, as shown in FIG. 8(b), by etching the transparent layer 9 using the etching mask pattern 7 as a mask, unnecessary portions are removed from the transparent layer 9 to form a high-refractive-index transparent portion (which is the dispersing elements 1a and 1b in the example illustrated in FIG. 8(b)). This etching process may be carried out as an anisotropic dry etching process. As a result of this etching process, tapered high-refractive-index transparent portions may be formed.

Subsequently, as shown in FIG. 8(c), after the etching mask pattern 7 has been removed, the gaps between the high-refractive-index transparent portions are filled with a second low-refractive-index transparent layer 6b which will also form part of the low-refractive-index transparent layer 6, thereby finishing forming the low-refractive-index transparent layer 6. The second low-refractive-index transparent layer 6b may be formed so as to cover the upper surface of the high-refractive-index transparent portions.

By adjusting the thickness of the first low-refractive-index transparent layer 6a, the distance from the bottom of the high-refractive-index transparent portions to the photosensitive cell array 200 can be controlled. The dispersing elements 1a and 1b which have mutually different light-splitting properties may have mutually different distances between the bottom of the high-refractive-index transparent portions and the photosensitive cell array 200. For that reason, in fabricating the dispersing element array 100 of this embodiment, the process step of changing the thickness of the first low-refractive-index transparent layer 6a from one position to another is performed. Such a process step may be carried out either by etching some portions of the first low-refractive-index transparent layer 6a from the surface or by defining a pattern for another low-refractive-index transparent layer on the first low-refractive-index transparent layer 6a before the transparent layer 9 is deposited. The pattern of that another low-refractive-index transparent layer may be defined by a lift-off process, for example.

Figure 9:
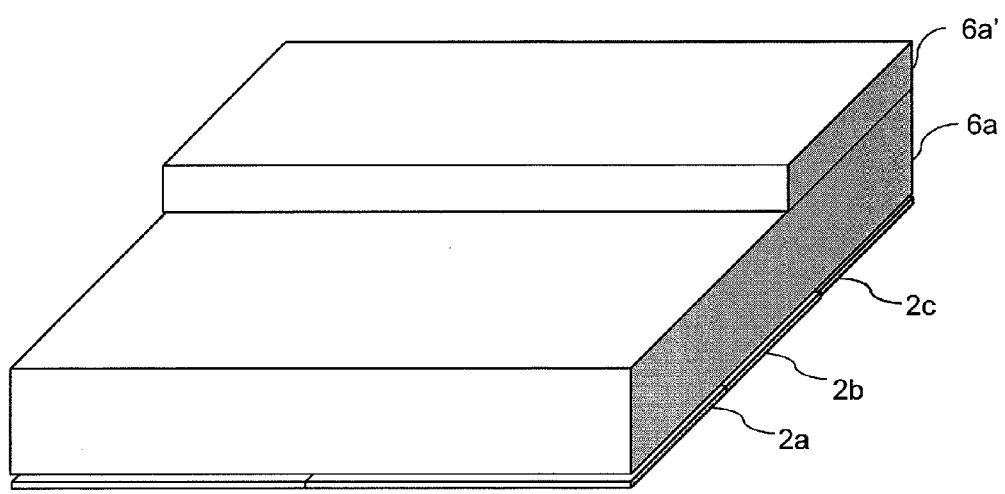
FIG. 9 A perspective view illustrating a portion of a structure in which a pattern of an additional low-refractive-index transparent layer 6*a*' has been formed on the first low-refractive-index transparent layer 6*a*.

FIG. 9 is a perspective view illustrating a portion of a structure in which a pattern of an additional low-refractive-index transparent layer 6a' has been formed on the first low-refractive-index transparent layer 6a. The pattern of the additional low-refractive-index transparent layer 6a' may be a striped pattern running in the y direction, for example.

Furthermore, the dispersing elements 1a and 1b which have different light-splitting properties may have mutually different heights (i.e., their sizes as measured in the z-axis direction may be different from each other). To change the heights of the dispersing elements 1a and 1b from one position to another, a transparent layer 9, of which the thickness varies from one position to another, may be deposited. Such a transparent layer 9 may be formed by depositing a transparent layer 9 to a substantially uniform thickness on the first low-refractive-index transparent layer 6a that has had level differences such as the one shown in FIG. 9 formed on the surface and then planarizing the upper surface of the transparent layer 9. If such planarization is performed, the upper surfaces of the high-refractive-index transparent portions that form the dispersing element array 100 will be level with each other. However, if the upper surface level of the high-refractive-index transparent portions should vary according to the types of the dispersing elements, the upper surface of high-refractive-index transparent portions which are located in particular areas may be masked and the upper surface of the other unmasked high-refractive-index transparent portions may be selectively etched.

It should be noted that such a method of fabricating the dispersing element array is just an example and does not always have to be used.

Next, it will be described what color components the light rays incident on the respective photosensitive cells have and how the image signal processing section 15 carries out signal processing.

As shown in FIG. 6A, one of the microlenses 4 according to this embodiment is arranged so as to cover not only the first dispersing element 1a and the first photosensitive cell 2a entirely but also the second photosensitive cell 2b partially as well. Another one of the microlenses 4 is arranged so as to cover not only the second dispersing element 1b and the third photosensitive cell 2c entirely but also the fourth photosensitive cell 2d partially as well. Since there is the non-light-splitting portion 3 in the areas that face the second and third photosensitive cells 2b and 2c, some incoming light W' is incident on those photosensitive cells 2b and 2d without being condensed or split (such incident light will be sometimes referred to herein as "directly incident light"). If the intensity of the visible radiation that would be incident on each of the photosensitive cells 2a and 2c were it not for the dispersing elements 1a and 1b is indicated by W (=R+G+B), the intensity of the directly incident light W' will be represented by kW (where k is a real number that satisfies 0<k<1). In this case, R, G and B represent the respective intensities of the colors red, green and blue components included in the incoming light.

Figure 10A:
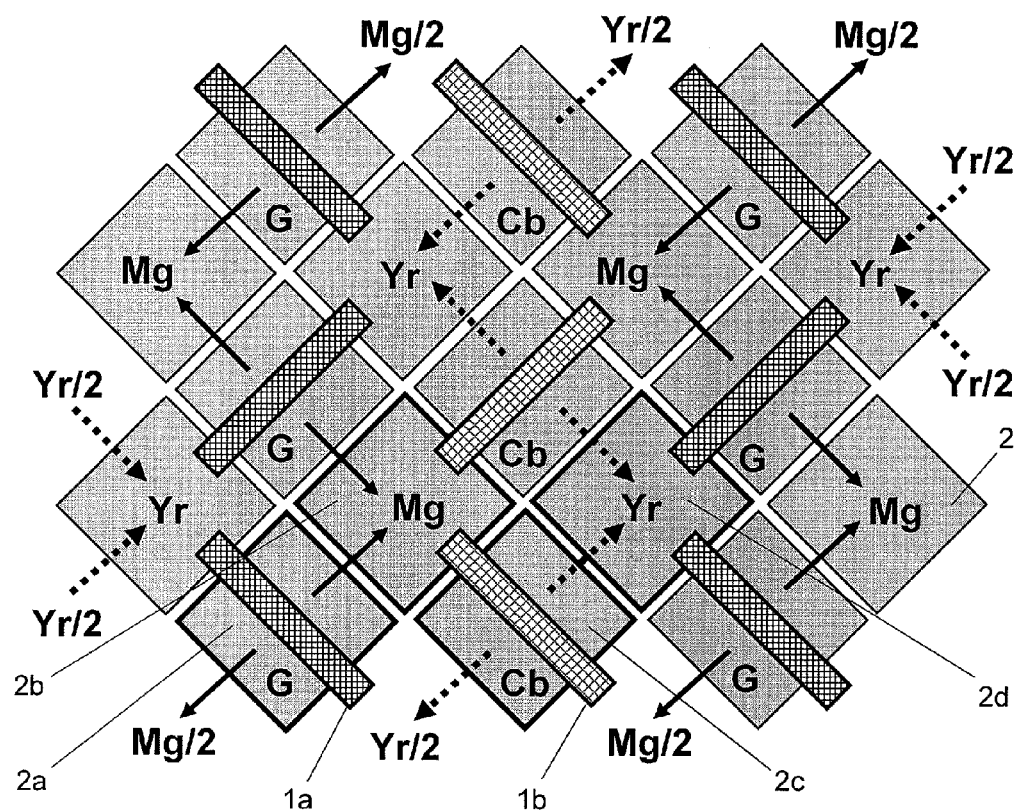
FIG. 10A Shows the distribution of incident light rays were it not for the non-light-splitting portions 3 according to the first embodiment.
Figure 10B:
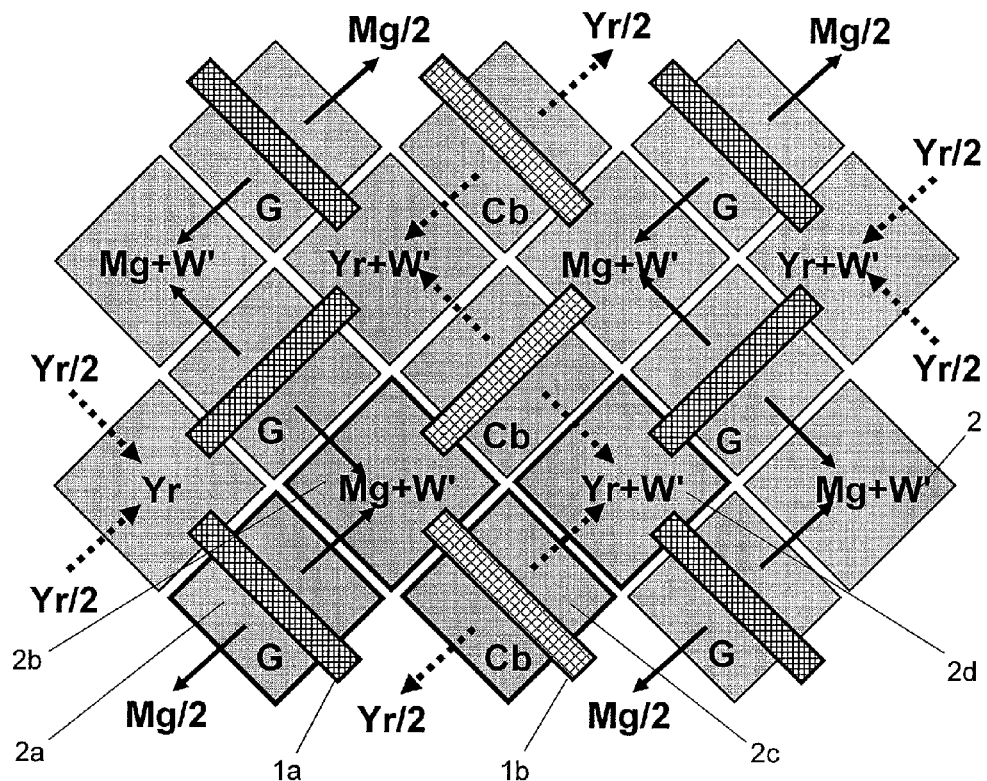
FIG. 10B Shows the distribution of incident light rays according to the first embodiment.
Figure 10C:
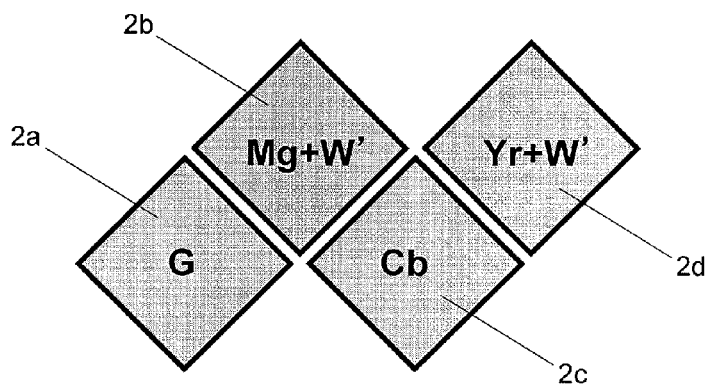
FIG. 10C Shows the distribution of incident light rays in a single unit block.

FIG. 10A shows what color components would be received by respective photosensitive cells were it not for the directly incident light W'. Thanks to the actions of the dispersing elements 1a and 1b, each photosensitive cell receives a light ray representing one of the colors G, Mg, Cb and Yr components. On the other hand, since there are the non-light-splitting portions 3 according to this embodiment, the second and fourth photosensitive cells 2b and 2d further receive the directly incident light W' as shown in FIG. 10B. FIG. 10C illustrates how photosensitive cells 2a, 2b, 2c and 2d belonging to a single unit block receive light. As shown in FIG. 10C, the photosensitive cells 2a, 2b, 2c and 2d receive light rays, of which the intensities are represented by G, Mg+W', Cb, and Yr+W', respectively.

In this case, signals representing respective components that are included in the photoelectrically converted signals are identified by adding the subscript "s" the reference signs indicating those components. Specifically, the signals representing the colors R, G, B, Mg, Cb, Yr, W, and W' components are identified by Rs, Gs, Bs, Mgs, Cbs, Yrs, Ws and W's, respectively. In this case, Ws=Rs+Gs+Bs, Mgs=Rs+Bs, Yrs=Rs+(1/2)Gs and Cbs=Bs+(1/2)Gs are satisfied. Then, the output signals S2a to S2d of the photosensitive cells 2a to 2d are represented by the following Equations (6) to (9), respectively:

$$S2a = Gs \tag{6}$$

$$S2b = Mgs + W's = Rs + Bs + k(Rs + Gs + Bs) \tag{7}$$

$$S2c = Cbs = Bs + (1/2)Gs \tag{8}$$

$$S2d = Yrs + W's = Rs + (1/2)Gs + k(Rs + Gs + Bs) \tag{9}$$

In this embodiment, k=1/4 is supposed to be satisfied. Then, the output signals of the photosensitive cells 2a to 2d are represented by the following Equations (10) to (13), respectively:

$$S2a = Gs \tag{10}$$

$$S2b = (5/4)Rs + (1/4)Gs + (5/4)Bs$$

$$S2c = Bs + (1/2)Gs \tag{12}$$

$$S2d = (5/4)Rs + (3/4)Gs + (1/4)Bs \tag{13}$$

By modifying these Equations (10) to (13), Rs, Gs and Bs can be represented by the following equations:

$$Rs=-(1/10)S2a+(2/5)S2b-(3/5)S2c+(2/5)S2d \quad (14)$$

$$Gs=S2a \quad (15)$$

$$Bs=(-1/2)S2a+S2c \quad (16)$$

By performing these arithmetic operations, RGB color signals can be obtained based on the output signals of the four photosensitive cells $2a$ to $2d$.

The image signal generating section 15 shown in FIG. 4A performs the arithmetic operations represented by Equations (14) and (15) using the photoelectrically converted signals S2a to S2d, thereby generating color information Rs, Gs and Bs. The image signal generating section 15 can obtain pixel-by-pixel color information by performing the same arithmetic operation on every pixel with an arithmetic operation unit consisting of four pixels shifted horizontally and vertically on a pixel basis, and therefore, can generate a color image.

Hereinafter, it will be described with reference to FIG. 11 in what procedure the image signal generating section 15 performs the color information generation processing.

Figure 11:
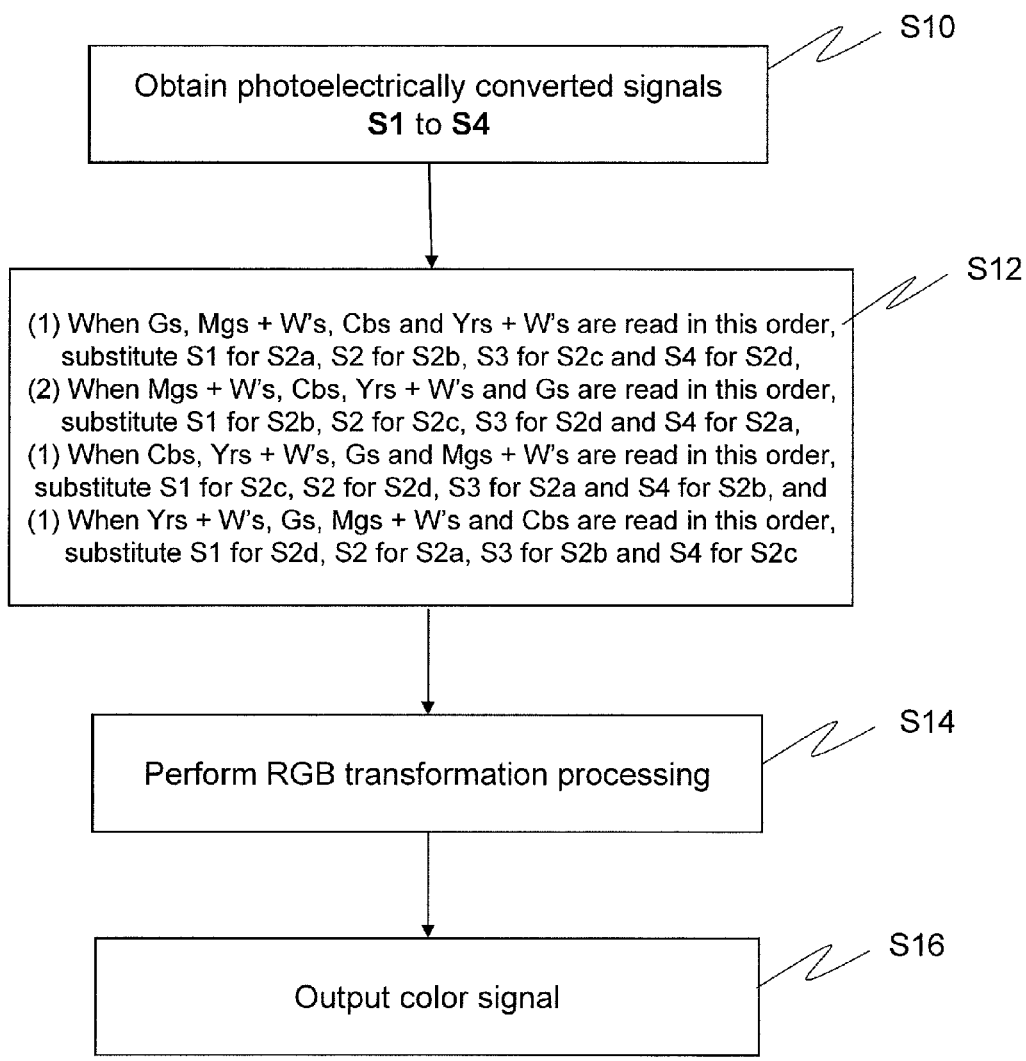
FIG. 11 A flowchart showing the procedure of color information generation processing according to the first embodiment.

FIG. 11 is a flowchart showing the procedure of color information generation processing according to this embodiment. First of all, in Step S10, the image signal generating section 15 obtains four photoelectrically converted signals, which will be identified herein by S1, S2, S3 and S4 in the order of extraction. If the unit block shown in FIG. 10C is used as an arithmetic operation unit, processing may be carried out on the supposition that S1=S2a, S2=S2b, S3=S2c, and S4=Std are satisfied. However, since the image signal generating section 15 performs the same kind of arithmetic operations with the arithmetic operation unit shifted horizontally on a pixel-by-pixel basis, the order of reading the signals changes every time the arithmetic operation is performed. For that reason, the image signal generating section 15 performs in Step S12 substitution processing while taking the correspondence between the signals S1 through S4 and the output signals S2a through S2d into consideration. Hereinafter, this processing will be described with reference to FIG. 12.

Figure 12:
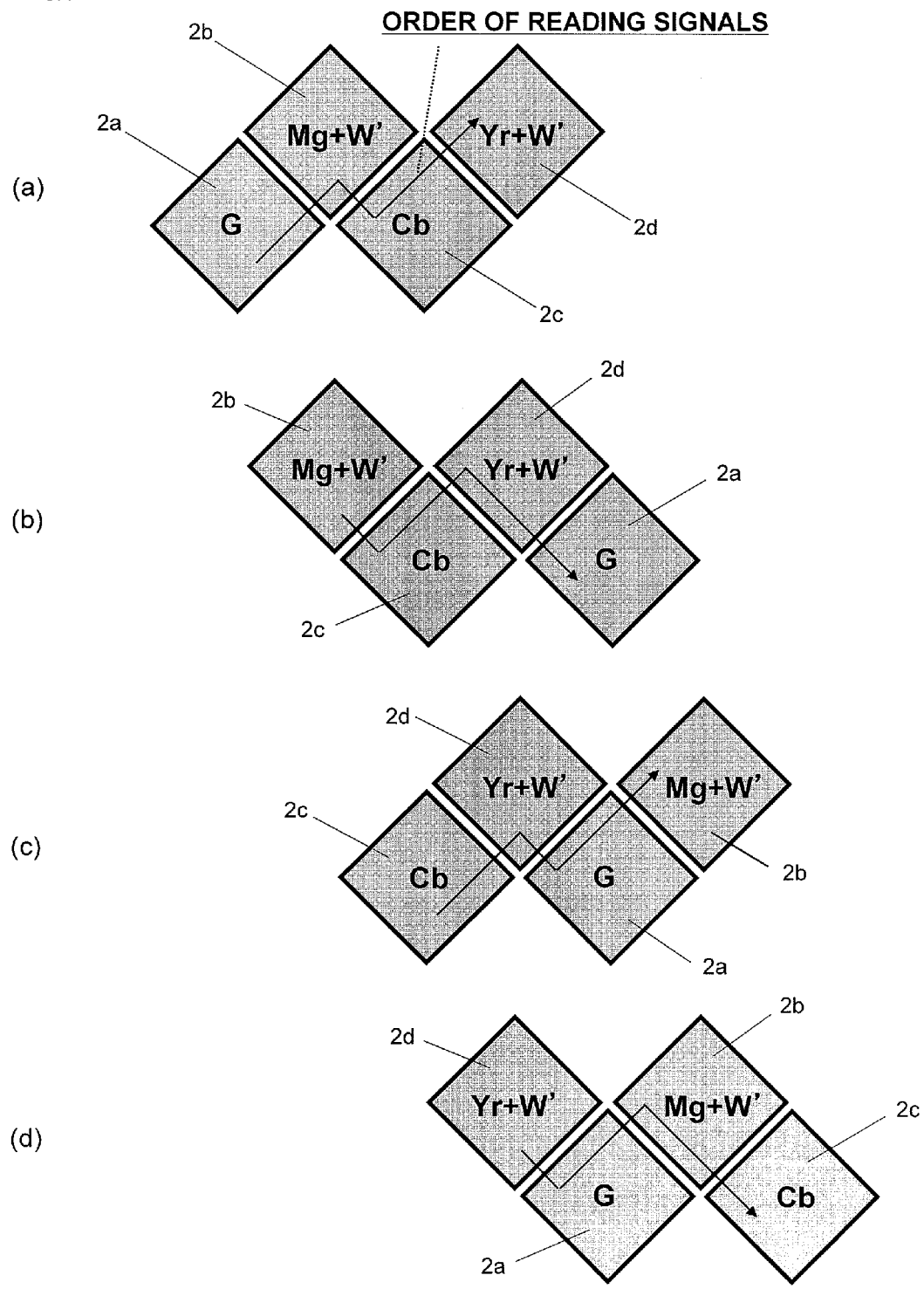
FIG. 12 (*a*) through (*d*) show how the order of reading the signals changes as the arithmetic operation unit shifts by one pixel.

FIG. 12 illustrates conceptually how to perform the arithmetic processing with the arithmetic operation unit shifted horizontally by one pixel after another. FIG. 12(a) shows the order in which the signals are read in a situation where the unit block shown in FIG. 10C is used as an arithmetic operation unit. Since S1=Gs, S2=Mgs+W's, S3=Cbs and S4=Yrs+W's are satisfied in this case, the arithmetic operations represented by Equations (14) and (15) can be applied as long as substitution is done so that S1=S2a, S2=S2b, S3=S2c and S4=S2d are satisfied. FIG. 12(b) shows the order in which the signals are read in a situation where the arithmetic operation unit has shifted horizontally by one pixel with respect to the state shown in FIG. 12(a). Since S1=Mgs+W's, S2=Cbs, S3=Yrs+W's and S4=Gs are satisfied in this case, the arithmetic operations represented by Equations (14) and (15) can be applied as long as substitution is done so that S1=S2b, S2=S2c, S3=S2d and S4=S2a are satisfied. FIG. 12(c) shows the order in which the signals are read in a situation where the arithmetic operation unit has shifted horizontally by one more pixel. Since S1=Cbs, S2=Yrs+W's, S3=Gs and S4=Mgs+W's are satisfied in this case, the arithmetic operations represented by Equations (14) and (15) can be applied as long as substitution is done so that S1=S2c, S2=S2d, S3=S2a and S4=S2b are satisfied.

And FIG. 12(d) shows the order in which the signals are read in a situation where the arithmetic operation unit has shifted horizontally by one more pixel. Since S1=Yrs+W's, S2=Gs, S3=Mgs W's and S4=Cbs are satisfied in this case, the arithmetic operations represented by Equations (14) and (15) can be applied as long as substitution is done so that S1=S2d, S2=S2a, S3=S2b and S4=S2c are satisfied.

By performing this substitution processing, the image signal generating section 15 can carry out the arithmetic processing described above on an arithmetic unit anywhere on the imaging area. Although it has been described how to perform that processing on a single row, the processing is carried out in the same way on any other row as well.

Using the signals S2a, S2b, S2c and S2a that have been obtained as a result of the processing described above, the image signal generating section 15 performs RGB transformation processing on every pixel in accordance with Equations (14) and (15) in Step S14 shown in FIG. 11. Finally, in Step S16, the image signal generating section 15 outputs a color image signal which is comprised of RGB signals thus transformed. In this case, the RGB signals may be corrected as needed. The color image signal thus generated may be output to a storage medium or display section (not shown) by the image signal output section 16.

As can be seen, the image capture device of this embodiment can obtain a color image signal by performing addition and subtraction processing using the photoelectrically converted signals S2a to S2d. The image sensor 10 of this embodiment uses no optical elements that would absorb light, and therefore, can reduce the loss of light significantly compared to the prior art that uses color filters, for example. In addition, since the size of a microlens is larger than that of its associated pixel, each pixel will have so high a signal level that the color reproducibility can be increased. A color representation method that uses the color signals Mgs, Gs, Yrs and Cbs as described above is disclosed as a method with excellent color reproducibility in Patent Document No. 4, for example. The color representation according to this embodiment uses basically the same color representation method as what is disclosed in Patent Document No. 4. However, the directly incident light identified by kW is also included. That is why if the coefficient k were too large, the ability to modulate the colors would sometimes decrease. However, by setting the coefficient k to be an appropriate value, good color reproducibility can be maintained.

In addition, according to this embodiment, even though the directly incident light kW is included, the coefficient k is 1/4, which is relatively small, and the incoming light W is made to be incident on a plurality of photosensitive cells separately. As a result, the dynamic range characteristic can be improved compared to the prior art. For example, the dynamic range characteristic can be improved compared to the techniques disclosed in Patent Documents Nos. 2 and 4.

Generally speaking, as far as a signal output from a solid-state image sensor is concerned, the G component is higher than the R or B component. The reason is that as an image sensor exhibits higher sensitivity to the G component than to the B component and that more light representing the G component will be incident on the image sensor than light representing the R component due to the influence of the infrared cut filter 11. Thus, the configuration of this embodiment is compared to the configurations of Patent Documents Nos. 2 and 4 on the supposition that the RGB component ratio is R:G:B=1:2:1. According to Patent Documents Nos. 2 and 4, if a color signal is indicated by Ci, a pixel signal with a relatively high signal level and a pixel signal with a relatively low signal level are indicated generally by W+Ci and W−Ci, respectively. If Ci is either an R signal or a B signal, a pixel signal Smax with a relatively high signal level is represented by either Smax=Ws+Rs or Smax=Ws+Bs. On the other hand, a pixel signal Smin with a relatively low signal level is represented by either 5 min=Ws−Rs or Smin=Ws−Bs. In this case, supposing Ws=1, Rs=1/4, Gs=1/2, and Bs=1/4 are satisfied, and therefore, Smax=1.25 and 5 min=0.75 are satisfied. Consequently, it can be seen that the ratio Smax/Smin of the signal level of the relatively high pixel signal to that of the relatively low pixel signal is 1.67 (=1.25/0.75).

On the other hand, according to this embodiment, if Rs=1/4, Gs=1/2, and Bs=1/4 are supposed to be satisfied and if these values are substituted for Equations (10) to (13), then S2a=0.5, S2b=0.75, S2c=0.5 and Std=0.75 are satisfied and therefore, Smax=0.75 and 5 min=0.5. Consequently, the ratio Smax/Smin of the signal level of the relatively high pixel signal to that of the relatively low pixel signal becomes 1.5 (=0.75/0.5). Thus, it can be seen that according to this embodiment, the dynamic range characteristic can be improved compared to the configurations of Patent Documents Nos. 2 and 4. Naturally, the smaller the value k, the more significantly the dynamic range characteristic can be improved. For example, if k=0, then S2a=0.5, S2b=0.5, S2c=0.5 and S2d=0.5 are satisfied and therefore, Smax/Smin=1. Consequently, the dynamic range characteristic can be improved significantly compared to the prior art.

On top of that, according to this embodiment, by providing the non-light-splitting portion 3 between the microlenses 4, the decrease in resolution can be minimized as well. As can be seen from FIG. 6A, were it not for the non-light-splitting portion 3, light rays that have been transmitted through the dispersing elements 1a and 1b would be incident on the photosensitive cells 2b and 2d but no light would be directly incident on those photosensitive cells 2b and 2d. This means that the light incident on the areas on the microlens array that face the photosensitive cells 2a and 2c cannot be detected. That is why were it not for the non-light-splitting portions 3, the photosensitive cells 2a and 2c should not contribute to increasing the resolution and the resolution would be determined by the number and pitch of the microlenses. Since the ratio of the number of pixels to the number of microlenses is two to one in this case, it can be said that the resolution would a half of the ordinary performance to be determined by the number of pixels. On the other hand, since almost the same number of non-light-splitting portions 3 as that of the microlenses 4 are provided, the photosensitive cells 2b and 2d that face the non-light-splitting portions 3 can obtain information about the light to be incident on the non-light-splitting portions 3. As a result, the decrease in resolution can be minimized and the resolution characteristic can be maintained at an ordinary level to be determined by the number of pixels and the pixel pitch.

As can be seen from the foregoing description, the value k that depends on the size of the non-light-splitting portion 3 is determined with the balance between the dynamic range characteristic and the resolution characteristic taken into consideration. Even though k is supposed to be 1/4 according to this embodiment, this is just an example and the coefficient k does not have to be this value.

As described above, in the image sensor 10 of this embodiment, a dispersing element array 100 including a dispersing element 1a which splits the incoming light into magenta and green rays and a dispersing element 1b which splits the incoming light into a blue ray including a half of the color green component and a red ray including the other half of the color green component is arranged so as to face a photosensitive cell array 200. In addition, a microlens array 400 including a plurality of microlenses 4 which are arranged to face the respective dispersing elements 3 and non-light-splitting portions 3 between those lenses is also arranged. As a result, (Mg+kW), G, (Yr+kW) and Cb signals are obtained from a unit block of pixels consisting of four photosensitive cells 2a through 2d, and RGB color signals can be obtained based on those signals. According to this embodiment, by using no color filters that would absorb most of the incoming light, the loss of light can be cut down, and by using a microlens of which the size is larger than that of a pixel, the image capturing sensitivity can be increased. In addition, since no light is overconcentrated at any particular pixel, an excellent dynamic range characteristic is realized, which is a significant advantageous effect in practice.

In the embodiment described above, the image signal generating section 15 is supposed to generate all of RGB color image signals. However, the image signal generating section 15 does not always have to generate all of those RGB color image signals. Alternatively, the image signal generating section 15 may also be configured to generate image signal(s) representing only one or two color components depending on the intended application.

Ideally, the light-splitting performance of the respective dispersing elements is exactly as described above. However, their light-splitting performances could be somewhat different from the ideal one. That is to say, the photoelectrically converted signals that are actually output from those photosensitive cells could be different to a certain degree from what is defined by Equations (6) to (9). Even if the light-splitting performances of the respective dispersing elements are slightly different from the ideal ones, good color information can still be obtained by correcting the signals according to the magnitude of the difference. As for equations for transforming those pixel signals into RGB signals, Equations (14) and (15) are just an example and any other equations may be used to make that transformation. For example, RGB signals can be obtained by performing an arithmetic operation using the matrix of Equation (5). In that case, if the signals are corrected using a transformation matrix with a slight difference between the actual and ideal light-splitting performances taken into account, even more ideal RGB signals can be obtained. Such a transformation matrix can be obtained by capturing a color chart with multiple color patterns and by determining the best matrix elements with actually obtained and ideal signals compared to each other.

Figure 13:
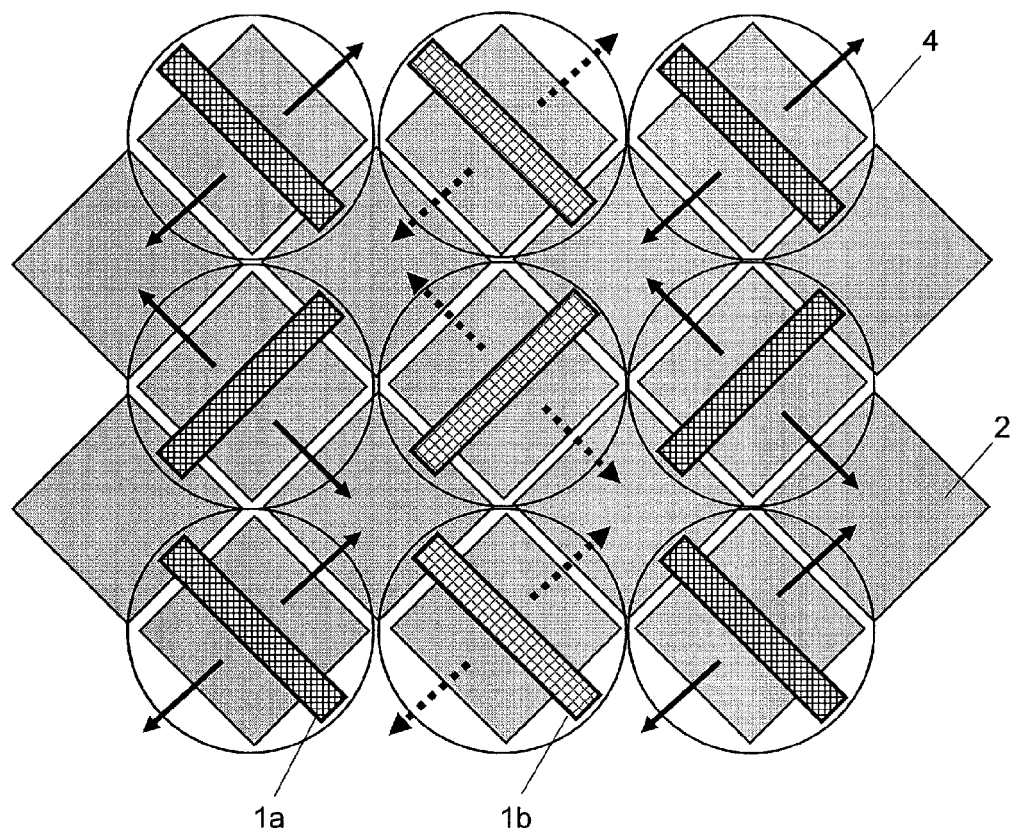
FIG. 13 A plan view illustrating the structure of an image sensor as a modified example of the first embodiment.

It should be noted that the basic structure of the image sensor 10 does not have to be the one shown in FIG. 6A. For example, the effect achieved by this embodiment will be no different even if the positions of the dispersing elements 1a and 1b are changed with each other. Likewise, even if the non-light-splitting portion 3 has a different shape from the one shown in FIG. 6B, its effectiveness does not change. For example, its effectiveness will remain the same even if the microlenses 4 have a circular shape as shown in FIG. 13.

Optionally, the signal arithmetic operations performed by the image signal generating section 15 of this embodiment may be performed by another device, not the image capture device itself. For example, the color information can also be generated by getting a program defining the signal arithmetic processing of this embodiment executed by an external device that has been provided with the photoelectrically converted signals by the image sensor 10.

In the foregoing description, an optical element which splits incoming light into two by taking advantage of a difference in refractive index between two members is used as the dispersing element. However, a dispersing element according to the present invention may be anything else as long as it can make a light ray with an intended color component incident on each photosensitive cell. For example, a micro prism may also be used as the dispersing element. Furthermore, multiple different kinds of dispersing elements (e.g., a high-refractive-index transparent portion and a micro-prism) may also be used in combination as well.

INDUSTRIAL APPLICABILITY

A solid-state image sensor and image capture device according to the present invention can be used effectively in every camera that ever uses a solid-state image sensor, and may be used in digital still cameras, digital camcorders and other consumer electronic cameras and in industrial surveillance cameras, to name just a few.

REFERENCE SIGNS LIST 1a, 1b dispersing element
2, 2a, 2b, 2c, 2d image sensor's photosensitive cell
3 non-light-splitting portion
4 microlens
5 image sensor's wiring layer
6 transparent layer
10 image sensor
11 infrared cut filter
12 optical lens
13 signal generating and receiving section
14 sensor driving section
15 image signal generating section
16 image signal output section
30 memory
40 photosensitive cell's unit block
100 dispersing element array
200 photosensitive cell array
300 image capturing section
400 microlens array
500 signal processing section

The invention claimed is:

1. A solid-state image sensor comprising:
a photosensitive cell array in which a plurality of unit blocks, each including first, second, third and fourth photosensitive cells, are arranged two-dimensionally on an imaging area;
a dispersing element array including first and second dispersing elements which are arranged to face the first and third photosensitive cells, respectively; and
a microlens array including a first microlens which is arranged to cover the first dispersing element, the first photosensitive cell and a part of the second photosensitive cell and a second microlens which is arranged to cover the second dispersing element, the third photosensitive cell and a part of the fourth photosensitive cell, the microlens array being configured so that incoming light that has reached a region which is covered with neither the first nor second microlens and which faces the second photosensitive cell is incident on the second photosensitive cell and that incoming light that has reached a region which is covered with neither the first nor second microlens and which faces the fourth photosensitive cell is incident on the fourth photosensitive cell,
wherein the first dispersing element makes light rays with first and second color components, which form respective parts of the incoming light that has come through the first microlens, incident on the first and second photosensitive cells, respectively,
the second dispersing element makes light rays with third and fourth color components, which form respective parts of the incoming light that has come through the second microlens, incident on the third and fourth photosensitive cells, respectively, and
the dispersing element array is configured so that light-splitting direction components that are parallel to the imaging area in a pair of the first dispersing elements which are located closest to each other intersect with each other at right angles and that second dispersing elements which are located closest to each other intersect with each other at right angles.

2. The solid-state image sensor of claim 1, wherein each of the first and second dispersing elements includes a high-refractive-index transparent portion and a low-refractive-index transparent portion which has a lower refractive index than the high-refractive-index transparent portion and which is arranged around the high-refractive-index transparent portion, and
at least one of the shape and size of the high-refractive-index transparent portion of the first dispersing element is different from that of the high-refractive-index transparent portion of the second dispersing element.

3. The solid-state image sensor of claim 2, wherein the respective high-refractive-index transparent portions of the first and second dispersing elements have a plate shape which intersects at right angles with the imaging area and are arranged parallel to each other.

4. The solid-state image sensor of claim 3, wherein the orientation of the high-refractive-index transparent portion in the first dispersing element is different by 90 degrees from that of the high-refractive-index transparent portion in the first dispersing element that faces an adjacent unit block, and
the orientation of the high-refractive-index transparent portion in the second dispersing element is different by 90 degrees from that of the high-refractive-index transparent portion in the second dispersing element that faces an adjacent unit block.

5. The solid-state image sensor of claim 1, wherein the first dispersing element makes one and the other halves of the light ray with the second color component that forms part of the incoming light incident on the second photosensitive cell of its own and on the second photosensitive cell in any of adjacent unit blocks, and
the second dispersing element makes one and the other halves of the light ray with the fourth color component that forms part of the incoming light incident on the fourth photosensitive cell of its own and on the fourth photosensitive cell in any of the adjacent unit blocks.

6. The solid-state image sensor of claim 1, wherein the second photosensitive cell receives not only the light rays with the second color component from the first dispersing element of its own and the first dispersing element in any of the adjacent unit blocks but also light rays with the first and second color components that have come directly without passing through the first and second microlenses, and outputs a photoelectrically converted signal based on the light rays received, and
the fourth photosensitive cell receives not only the light rays with the fourth color component from the second dispersing element of its own and the second dispersing element in any of the adjacent unit blocks but also light rays with the third and fourth color components that have come directly without passing through the first and second microlenses, and outputs a photoelectrically converted signal based on the light rays received.

7. The solid-state image sensor of claim 1, wherein the first dispersing element makes a majority of the light ray with the first color component, which forms part of the incoming light, incident on the first photosensitive cell that faces the first dispersing element, and the second dispersing element makes a majority of the light ray with the third color component, which forms part of the incoming light, incident on the third photosensitive cell that faces the second dispersing element.

8. The solid-state image sensor of claim 1, wherein the second color component is the complementary color of the first color component and the fourth color component is the complementary color of the third color component.

9. The solid-state image sensor of claim 1, wherein the first color component is one of magenta and green, the second color component is the other of magenta and green, the third color component is one of red with a tint of green and blue with a tint of green, and the fourth color component is the other of red with a tint of green and blue with a tint of green.

10. An image capture device comprising:

the solid-state image sensor of claim 1;

an optical system which produces an image on the solid-state image sensor; and a signal processing section which processes the output signals of the solid-state image sensor and which generates color information by performing an arithmetic operation using first, second, third and fourth photoelectrically converted signals supplied from the first, second, third and fourth photosensitive cells, respectively.

11. A method for processing the output signals of the solid-state image sensor of claim 1, the method comprising the steps of:

getting first, second, third and fourth photoelectrically converted signals from the first, second, third and fourth photosensitive cells, respectively; and generating color information using the first through fourth photoelectrically converted signals.

12. A computer program, stored on a non-transitory computer readable storage medium, for processing the output signals of the solid-state image sensor of claim 1, the program being defined to make a computer perform the steps of:

getting first, second, third and fourth photoelectrically converted signals from the first, second, third and fourth photosensitive cells, respectively; and generating color information using the first through fourth photoelectrically converted signals.

* * * * *